(12) United States Patent
Schober et al.

(10) Patent No.: US 11,799,198 B2
(45) Date of Patent: Oct. 24, 2023

(54) COMPONENT CARRIER-BASED DEVICE WITH ANTENNA COUPLING OF ELECTRONIC COMPONENT AND THERMAL COUPLING ON OPPOSING SIDES

(71) Applicant: AT&S Austria Technologie & Systemtechnik Aktiengesellschaft, Leoben (AT)

(72) Inventors: Mario Schober, Trofaiach (AT); Johannes Stahr, St. Lorenzen im Mürztal (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/453,153

(22) Filed: Nov. 1, 2021

(65) Prior Publication Data

US 2022/0140475 A1    May 5, 2022

(30) Foreign Application Priority Data

Nov. 2, 2020 (EP) .................................... 20205167

(51) Int. Cl.
    *H03M 1/38* (2006.01)
    *H01Q 1/38* (2006.01)
    (Continued)

(52) U.S. Cl.
    CPC ................. *H01Q 1/38* (2013.01); *H01Q 1/02* (2013.01); *H01Q 1/2283* (2013.01); *H01Q 1/422* (2013.01)

(58) Field of Classification Search
    CPC .......... H01Q 1/38; H01Q 1/02; H01Q 1/2238; H01Q 1/422
    (Continued)

(56) References Cited

U.S. PATENT DOCUMENTS

2003/0122724 A1* 7/2003 Shelley ..................... H01Q 5/55
                                                         343/786
2012/0063094 A1   3/2012 Gaynes et al.
(Continued)

FOREIGN PATENT DOCUMENTS

| JP | 2015211056 A | 11/2015 |
| WO | 2017222471 A1 | 12/2017 |
| WO | 2019167403 A1 | 9/2019 |

OTHER PUBLICATIONS

Lecoutre, R.; Extended European Search Report; pp. 1-11; dated Apr. 16, 2021; European Patent Office; 80298, Munich, Germany.
(Continued)

*Primary Examiner* — Peguy Jean Pierre
(74) *Attorney, Agent, or Firm* — Robert A. Blaha; Smith Tempel Blaha LLC

(57) ABSTRACT

An electronic device includes a first component carrier with a first stack having at least one first electrically conductive layer structure forming an antenna structure and at least one first electrically insulating layer structure; at least one electronic component, and a second component carrier having at least one second electrically conductive layer structure and/or at least one second electrically insulating layer structure. The second component carrier further includes a heat removal structure. The first component carrier and the second component carrier are connected so that the antenna structure is positioned at one side of the electronic device for emitting and/or receiving electromagnetic radiation and the heat removal structure is positioned at an opposing other side of the electronic device.

20 Claims, 14 Drawing Sheets

(51) Int. Cl.
*H01Q 1/02* (2006.01)
*H01Q 1/22* (2006.01)
*H01Q 1/42* (2006.01)

(58) Field of Classification Search
USPC .......................................................... 343/702
See application file for complete search history.

(56) References Cited

U.S. PATENT DOCUMENTS

| 2018/0159203 | A1 | 6/2018 | Baks et al. |
| 2018/0332151 | A1 | 11/2018 | Kamgaing et al. |
| 2019/0172802 | A1 | 6/2019 | Chen et al. |
| 2019/0173195 | A1 | 6/2019 | Kim et al. |
| 2020/0051894 | A1 | 2/2020 | Wan et al. |
| 2021/0249326 | A1* | 8/2021 | Uppal .................... H01L 23/42 |

OTHER PUBLICATIONS

Nawaz, A. et al.; "Organically Packaged Components and Modules: Recent Advancements for Microwave and mm-Wave Applications", vol. 20, No. 11, pp. 49-72; Nov. 1, 2019; IEEE Microwave Magazine, IEEE Service Center, Piscataway, NJ, USA.

* cited by examiner

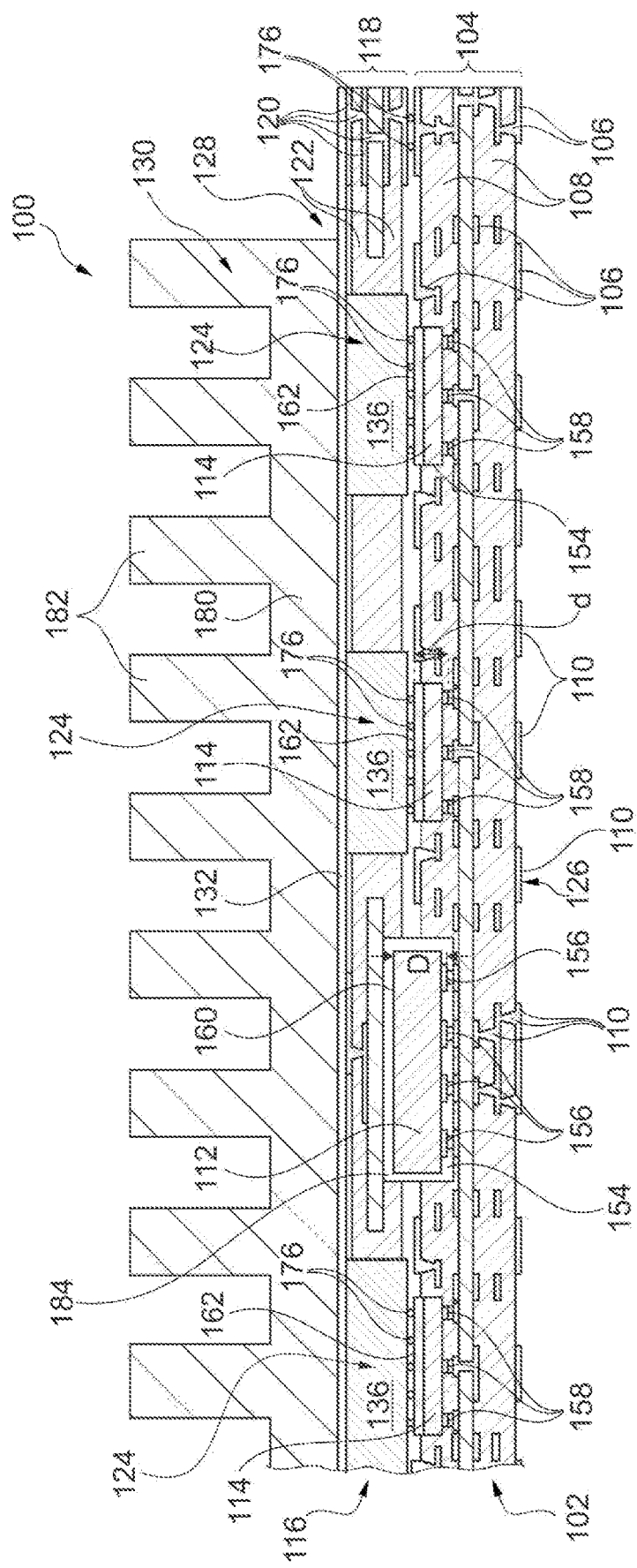

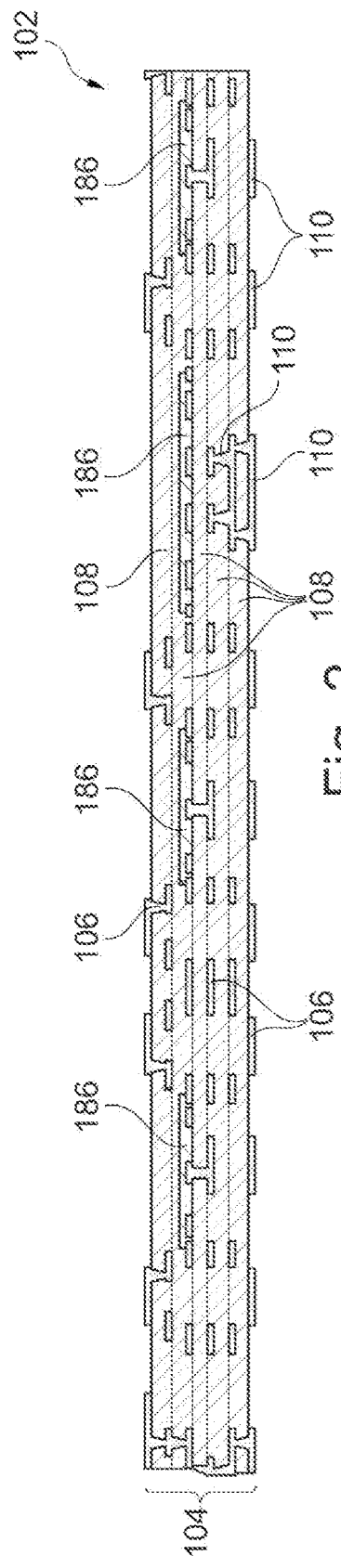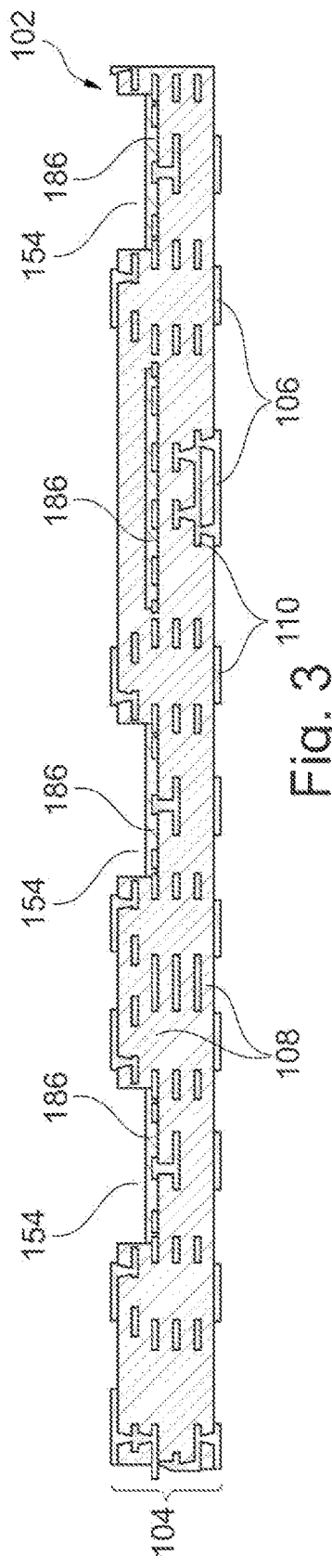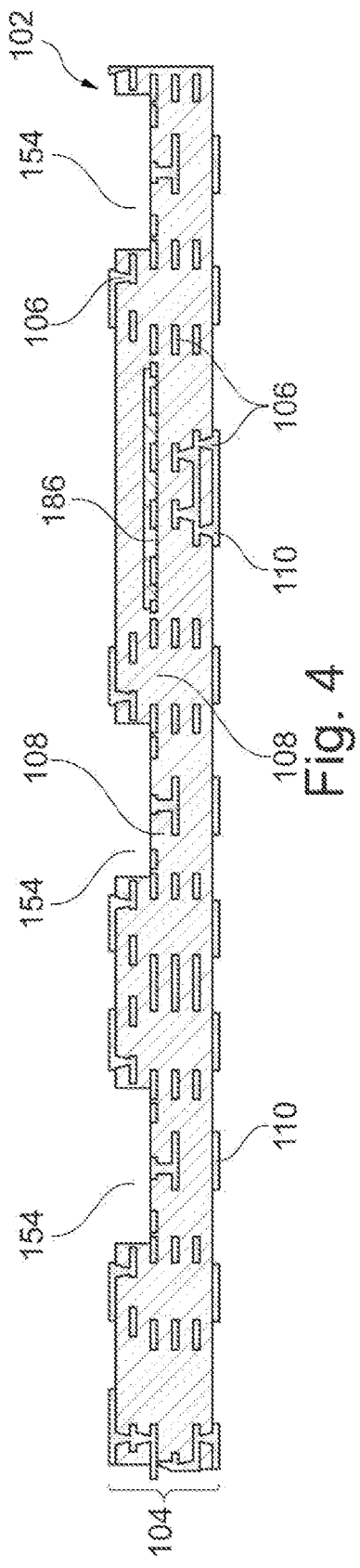

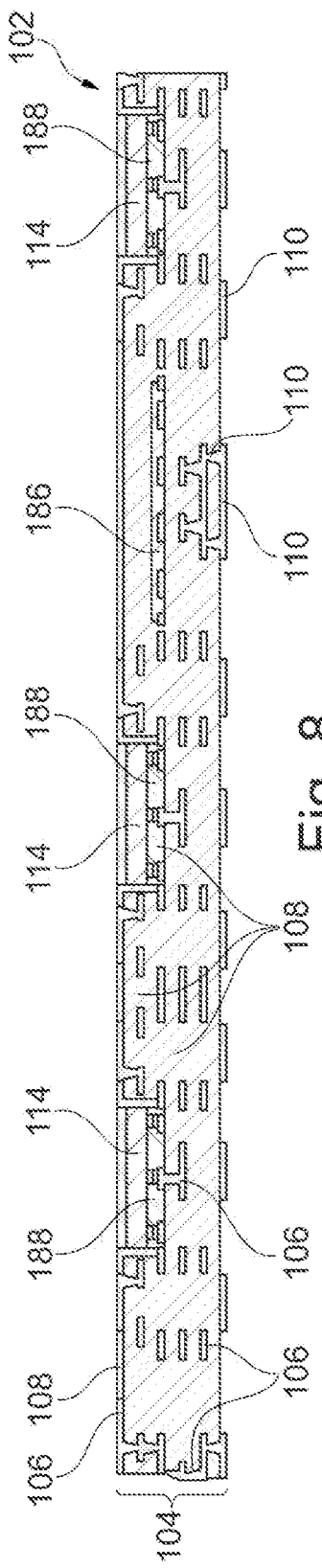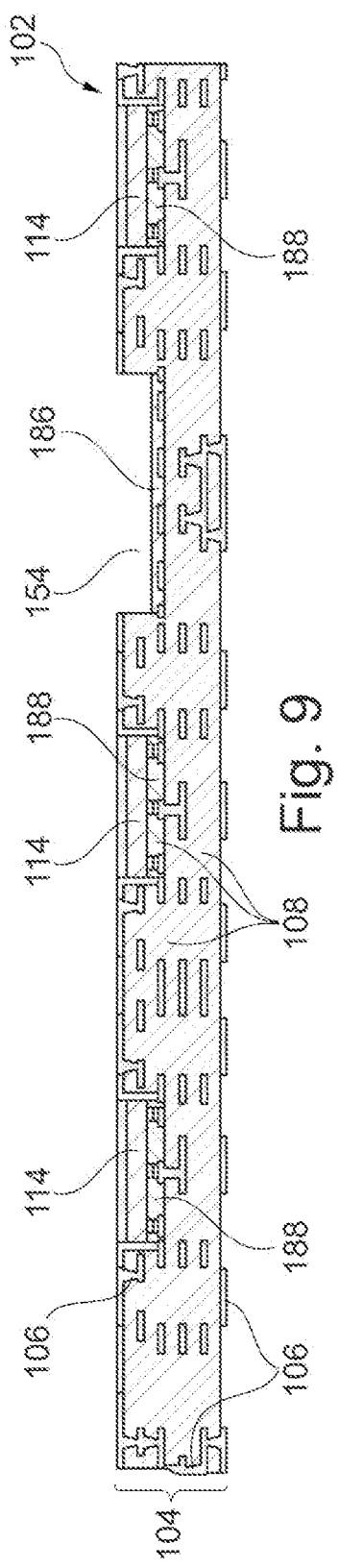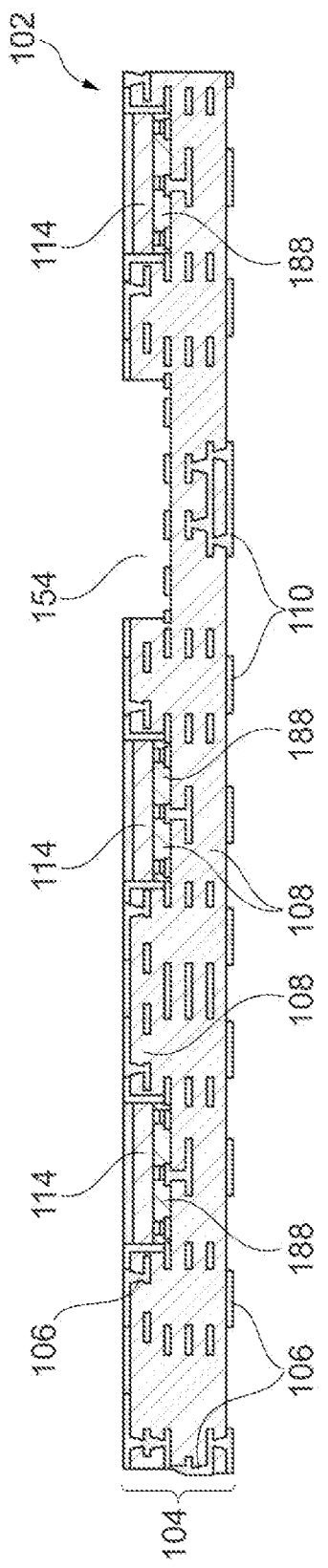

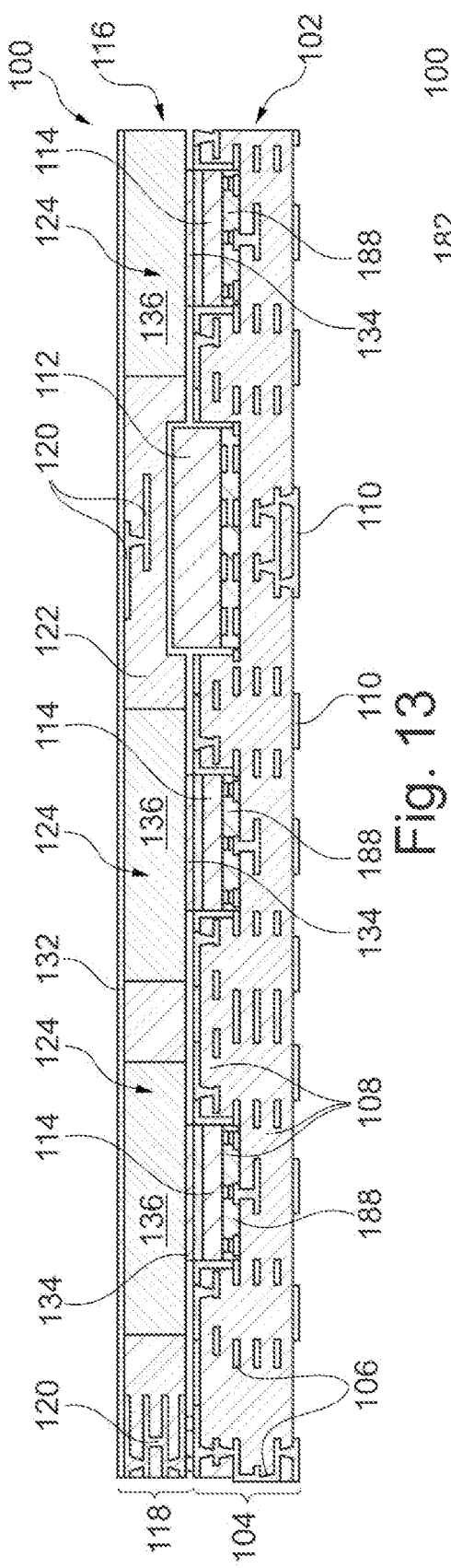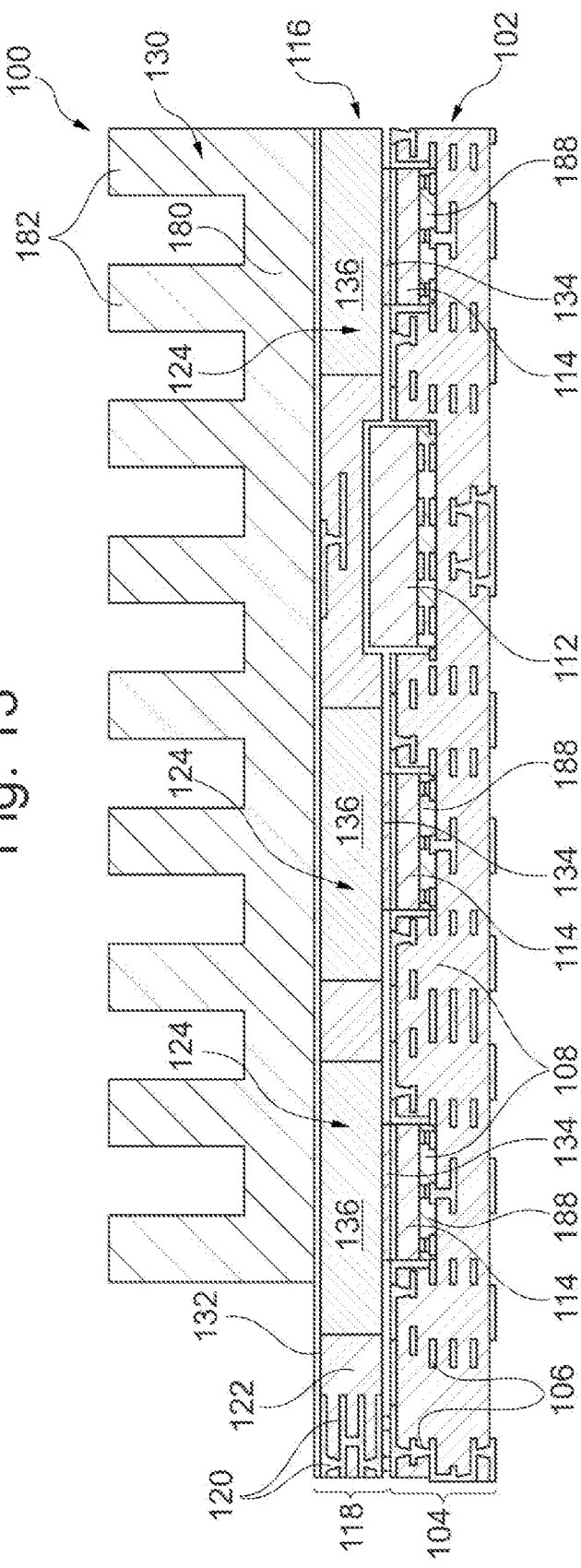

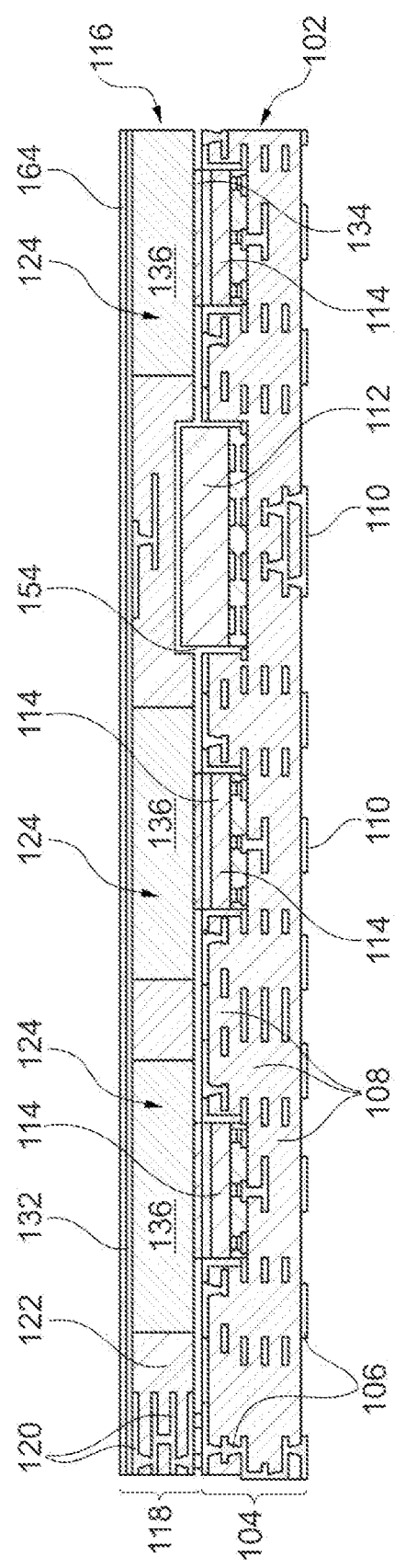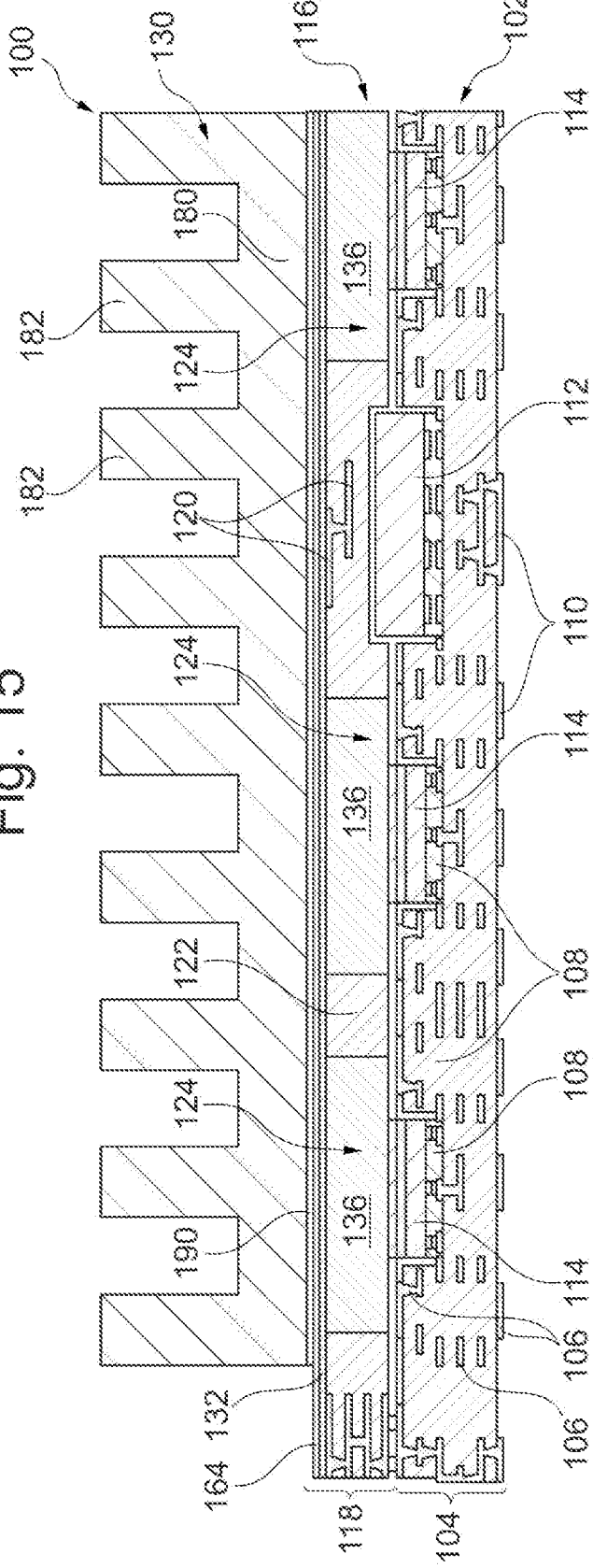

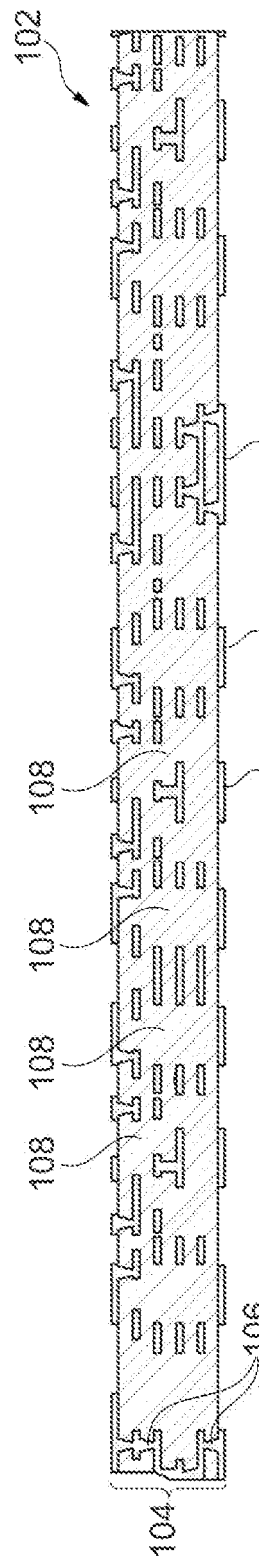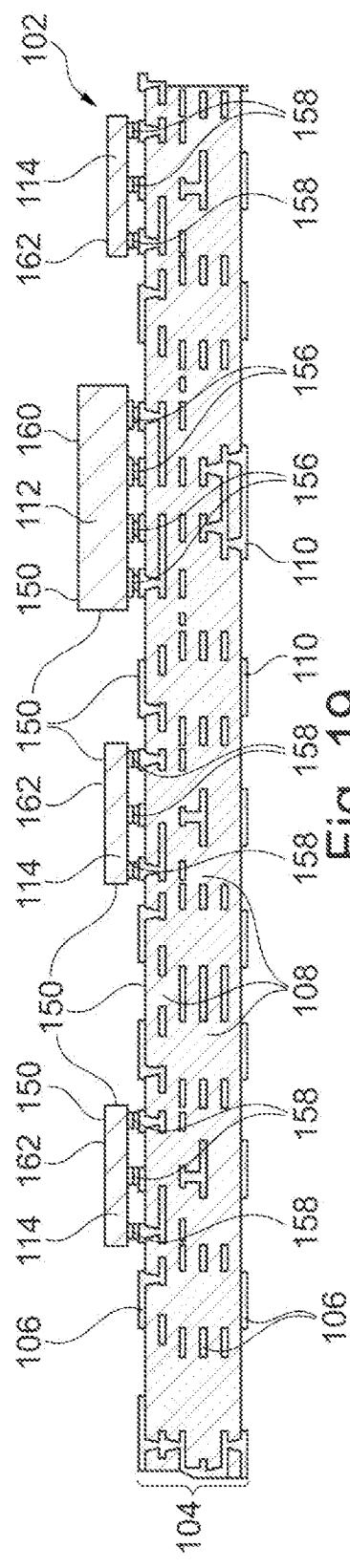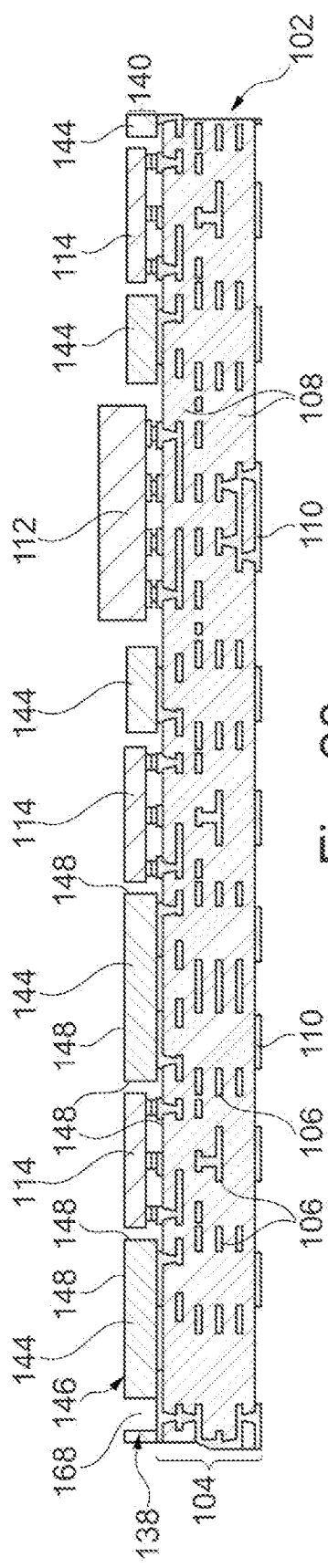

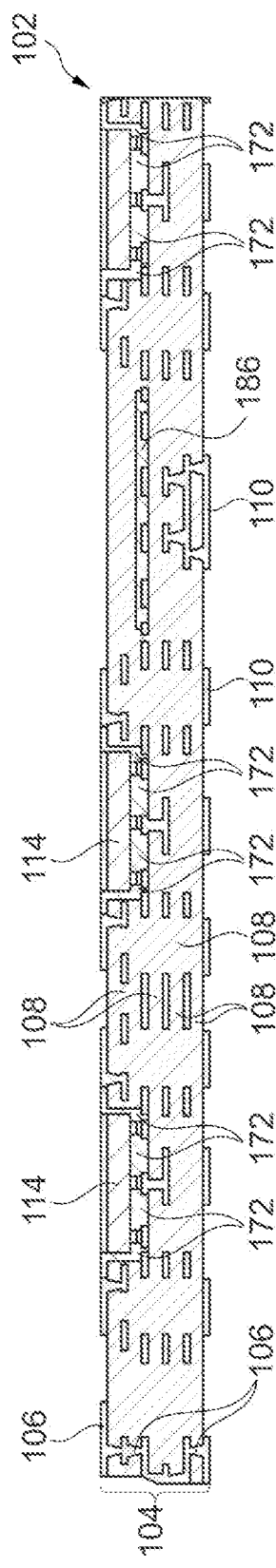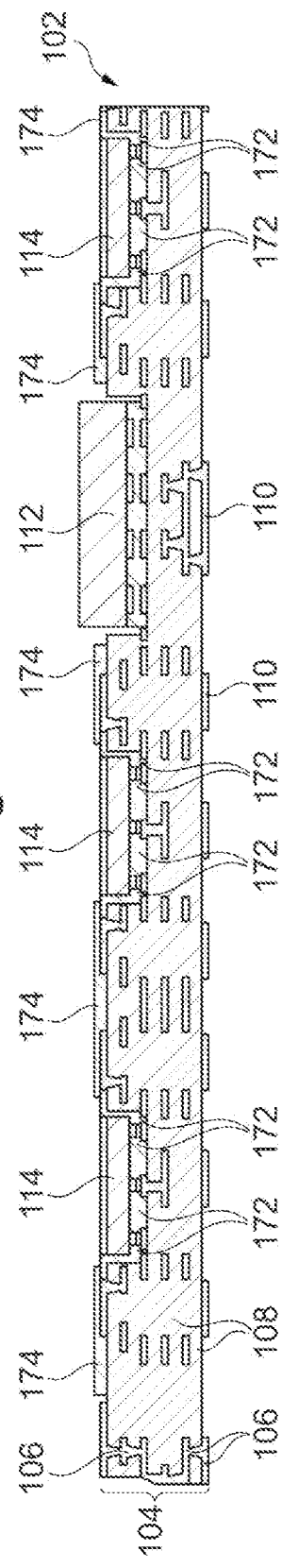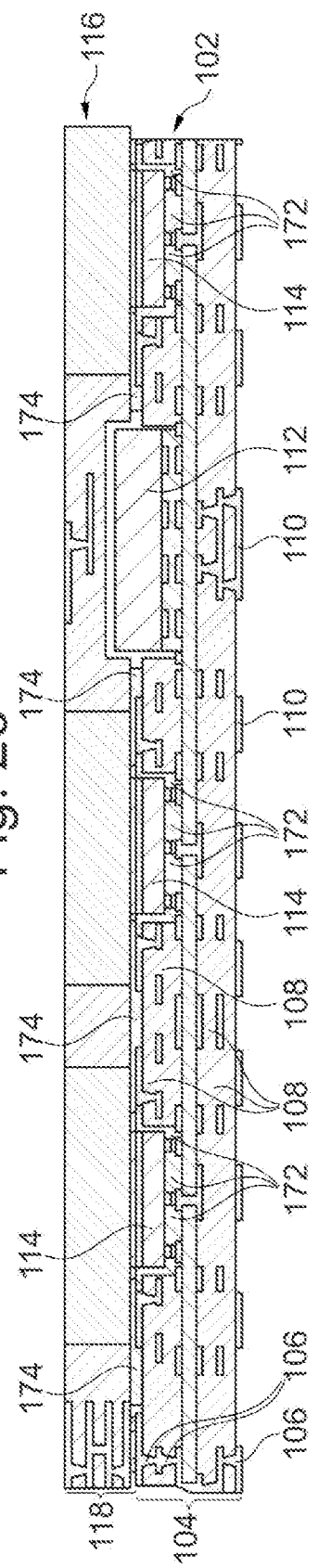

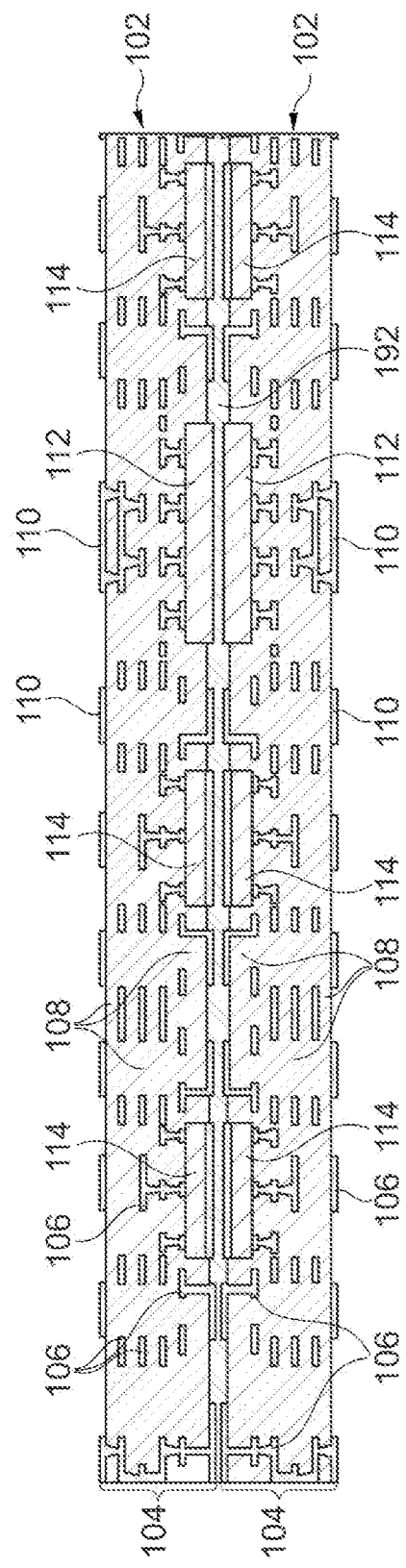
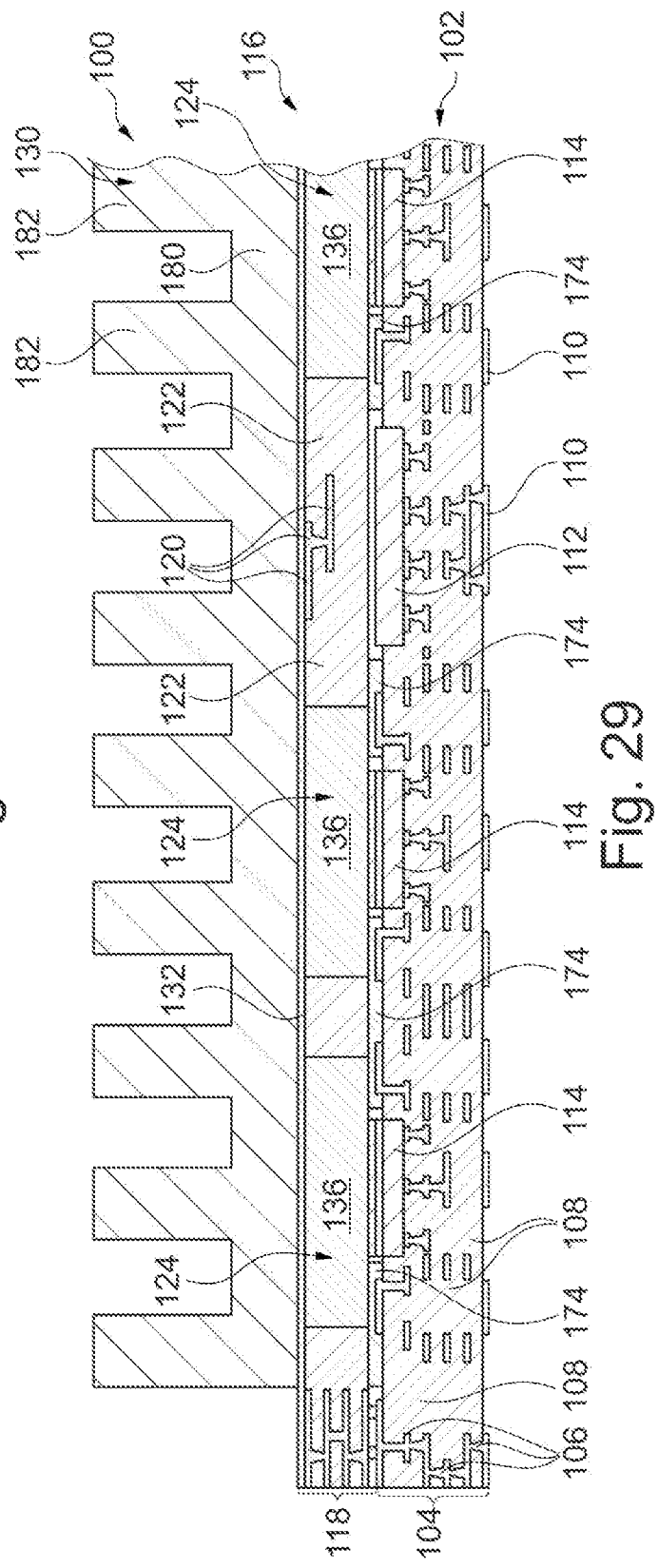
Fig. 28
Fig. 29

COMPONENT CARRIER-BASED DEVICE WITH ANTENNA COUPLING OF ELECTRONIC COMPONENT AND THERMAL COUPLING ON OPPOSING SIDES

CROSS-REFERENCE TO RELATED APPLICATION

This application claims the benefit of the filing date of the European patent application no. 20 205 167.8 filed Nov. 2, 2020, which is incorporated herein by reference in its entirety.

TECHNICAL FIELD

The invention relates to relates to a method of manufacturing an electronic device, and to an electronic device.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular high frequency chips may generate a considerable amount of heat during operation which may limit the performance and reliability of an electronic device. Hence, efficiently removing heat from an electronic component in an electronic device is an issue.

SUMMARY

There may be a need for an electronic device with wireless signal transmission capability and efficient heat removal.

According to an exemplary embodiment of the invention, an electronic device is provided which comprises a first component carrier which comprises a first stack, the first stack having at least one first electrically conductive layer structure forming an antenna structure and having at least one first electrically insulating layer structure, wherein the first component carrier further comprises at least one electronic component, and a second component carrier having at least one second electrically conductive layer structure and/or at least one second electrically insulating layer structure (wherein the second component carrier may in particular comprise a second stack having the at least one second electrically conductive layer structure and/or the at least one second electrically insulating layer structure), wherein the second component carrier further comprises a heat removal structure, wherein the first component carrier and the second component carrier are connected so that the antenna structure is positioned at one side of the electronic device for emitting and/or receiving electromagnetic radiation, and the heat removal structure is positioned at an opposing other side of the electronic device (for instance so as to be thermally connectable with a cooling unit).

According to another exemplary embodiment of the invention, a method of manufacturing an electronic device is provided, wherein the method comprises forming a first component carrier which comprises a first stack, the first stack having at least one first electrically conductive layer structure forming an antenna structure and having at least one first electrically insulating layer structure, wherein the first component carrier further comprises at least one electronic component, forming a second component carrier having at least one second electrically conductive layer structure and/or at least one second electrically insulating layer structure (wherein the second component carrier may in particular comprise a second stack having the at least one second electrically conductive layer structure and/or the at least one second electrically insulating layer structure), wherein the second component carrier further comprises a heat removal structure, and connecting the first component carrier and the second component carrier so that the antenna structure is positioned at one side of the electronic device for emitting and/or receiving electromagnetic radiation, and the heat removal structure is positioned at an opposing other side of the electronic device (for instance so as to be thermally connectable with a cooling unit).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer, or a plurality of non-consecutive islands within a common plane.

In the context of the present application, the term "electronic component" may particularly denote a component fulfilling an electronic task. For instance, such an electronic component may be a semiconductor chip comprising a semiconductor material, in particular as a primary or basic material. The semiconductor material may for instance be a type IV semiconductor such as silicon or germanium or may be a type III-V semiconductor material such as gallium arsenide. In particular, the semiconductor component may be a semiconductor chip such as a naked die or a molded die.

In the context of the present application, the term "heat removal structure" may particularly denote an arrangement of thermally connected elements directing heat with high thermal conductivity out of an electronic device or part thereof, for instance away from an electronic component (as a heat source) or a component carrier comprising such an electronic component. In particular, such a heat removal structure may comprise one or preferably a plurality of thermally conductive blocks. For example, such a block may be a bulky body (such as a body shaped as a cuboid or cylinder or disc) made of a material having a high thermal conductivity. Preferably, the thermal conductivity of the material of a thermally highly conductive block may be at least 50 W/mK, in particular at least 100 W/mK.

In the context of the present application, the term "antenna structure" may particularly denote an electrically conductive structure shaped, dimensioned, and configured to be capable of receiving and/or transmitting electromagnetic radiation signals corresponding to electric or electromagnetic signals which may be conducted along electrically conductive layer structures of the component carrier(s). By such an antenna structure integrated in the first component carrier, a signal may be coupled into an electronic component or out of an electronic component of the first component carrier. In an embodiment, an antenna structure may comprise one antenna, or a plurality of different antennas.

According to an exemplary embodiment of the invention, an electronic device is provided which is composed of at least two different and mutually connected component carriers. A first component carrier has surface mounted, arranged in a cavity and/or embedded in an interior thereof, one or preferably a plurality of electronic components such as semiconductor chips, which may be electrically coupled with an antenna structure also forming part of said first component carrier. Hence, the electronic functionality of the electronic device may be integrated predominantly into said first component carrier. In order to efficiently remove heat created by the one or more electronic components of the first component carrier during operation of the electronic device, the electronic device may comprise a second component carrier having an integrated heat removal structure being thermally coupled with the electronic component(s). By spatially separating a heat removal functionality on one side of the electronic device from a wireless signal transmission and processing functionality on the opposing other side of the electronic device, both functionalities may be fulfilled independently from each other. In particular, it may be efficiently possible to conduct heat from the electronic component(s) generated during operation of the electronic device away from an interior of the first component carrier and away from its antenna structure in particular up to a periphery of the electronic device via highly conductive blocks with low thermal resistance and with short thermal path(s). Also the electric paths between antenna structure and electronic component(s) may be kept small, which suppresses signal loss and creation of ohmic heat. This improves the electric performance, the thermal performance and thus the overall reliability of the component carrier since undesired effects such as the generation of thermal stress and consequently undesired phenomena such as warpage may be strongly suppressed. The electronic device may therefore provide an improved heat management, may allow a miniaturization of the antenna array, and may reduce signal losses.

In the following, further exemplary embodiments of the manufacturing method and the electronic device will be explained.

In an embodiment, the electronic device comprises the cooling unit connected at the opposing side, i.e., connected to the second component carrier. The cooling unit may be thermally coupled with the second component carrier so that heat created by the one or more electronic components of the first component carrier can be conducted via the heat removal structure of the second component carrier to the cooling unit so as to be dissipated.

For instance, the cooling unit comprises a thermally conductive bulk body (optionally with or without cooling fins extending therefrom), a liquid cooling system, and/or a gas cooler comprising a ventilator. The mentioned bulk body may be a metallic plate which may be attached to the second component carrier and from which a plurality of metallic fins protrudes parallel to each other so that an efficient heat removal is possible as a consequence of the high heat exchange area provided by the fins. The mentioned fins are optional but highly preferred as they may significantly increase the effective surface usable for heat distribution and/or dissipation. Additionally or alternatively, the cooling unit may be a liquid cooling system having at least one flow channel through which a liquid cooling medium (such as water) flows for removing heat from the mutually connected component carriers. In yet another embodiment, cooling of the interconnected component carriers may be accomplished by a gas cooler, for instance comprising a ventilator generating and directing a flow of gas along a thermal coupling surface of the second component carrier for removing heat created in the first component carrier.

In an embodiment, the electronic device comprises a thermally conductive coupling structure, in particular an electrically insulating thermal coupling structure (such as a dielectric thermal interface material (TIM) or a thermal prepreg), at an interface between the second component carrier and the cooling unit.

For instance, such a TIM may be a material promoting a thermic coupling, and may be for example embodied as a sheet, a paste, or a sputtered material. For example, an electrically insulating TIM may have a thermal conductivity of 3 W/mK to 10 W/mK, for instance 4 W/mK. An electrically conductive TIM (such as an electrically conductive metal paste, for instance a metal paste or a carbon paste) may have an even higher thermal conductivity of for instance more than 20 W/mK. Thus, the thermal coupling resistance between second component carrier and cooling unit may be reduced and the heat removal capability may be further promoted by an interposed thermally conductive coupling structure embodied as TIM.

A thermally conductive coupling structure embodied as a thermal prepreg may have, for example, a thermal conductivity of at least 1.4 W/mK, in particular of at least 1.8 W/mK, and preferably of at least 2 W/mK. Consequently, such a thermal prepreg may provide a pronounced contribution to the heat removal and may therefore be effective at an exterior position of the stack of the second component carrier. Such a thermal prepreg may be at least partially uncured (for instance may comprise B-stage resin) when applied to the second component carrier or the cooling unit and may be connected by lamination. One or more other electrically insulating layer structures of the second component carrier may for instance be made of ordinary prepreg and may have, for example, a thermal conductivity of 0.4 W/mK to 1.2 W/mK. Alternatively, also said one or more other electrically insulating layer structures may be made of a thermal prepreg.

When said thermally conductive coupling structure between second component carrier and cooling unit is made of a dielectric material, electric isolation of the electronic device and thus its reliability can be further increased, and the disruptive strength may be improved.

In an embodiment, the electronic device comprises a (for instance further) second thermally conductive coupling structure, in particular an electrically conductive or electrically insulating thermal coupling structure (such as a thermal interface material (TIM) or thermal prepreg), between the first component carrier and the second component carrier. With regard to advantageous materials for this second thermally conductive coupling structure, reference is made to the preceding paragraphs.

In one embodiment, a second thermally conductive coupling structure is only present between the first component carrier and the second component carrier, but not between the second component carrier and the cooling unit. In such an embodiment, it may be preferred that the second thermally conductive coupling structure is made of a dielectric material for ensuring a high disruptive strength and therefore electric reliability of the electronic device. If, in another embodiment, an electrically insulating first thermally conductive coupling structure is present between the second component carrier and the cooling unit and a second thermally conductive coupling structure is present between the first component carrier and the second component carrier, it may be preferred that the latter mentioned second thermally conductive coupling structure is electrically conductive. In the latter mentioned embodiment, the electric reliability of the electronic device is already ensured by the dielectric first thermally conductive coupling structure at the cooling unit so that an electrically conductive second thermally conductive coupling structure is acceptable from a safety point of view between the first and the second component carrier. Since electrically conductive thermally conductive coupling structures may have a significantly larger value of the thermal conductivity (for example at least 20 W/mK, preferably at least 30 W/mK) than dielectric ones, the thermal coupling between the first and the second component carriers may be improved by such an electrically conductive second thermally conductive coupling structure (for instance a carbon paste or a metal paste) without compromising electric reliability thanks to the dielectric first thermally conductive coupling structure between the second component carrier and the cooling unit.

In one embodiment, only a single electronic component is provided at the first component carrier. In a preferred embodiment, a plurality of electronic components is provided at the first component carrier. For instance, at least four, preferably at least ten, electronic components are provided at the first component carrier. Different electronic components of the first component carrier may all have the same height or may have different heights.

In an embodiment, the at least one electronic component comprises at least one controller chip, in particular at least one baseband controller chip. For example, the controller chip may control other electronic components, in particular radiofrequency chips. For instance, a baseband controller chip may provide a modulated signal to a radiofrequency chip and/or may switch between a receiving mode and a transmitting mode of the electronic device.

In an embodiment, the at least one electronic component comprises at least one radiofrequency chip (RFIC, radiofrequency integrated circuit). The one or more radiofrequency chips may be the main heat source during operation of the electronic device since radiofrequency chips may contribute a high power density. Descriptively speaking, a radiofrequency chip may function as a power amplifier providing transmission power for transmitted signals. Said radiofrequency chips may also have an integrated receiver function. For example, the electronic device may comprise a plurality of radiofrequency chips, in particular at least ten radiofrequency chips, more particularly at least one hundred radiofrequency chips. For each radiofrequency chip, an assigned and thermally coupled highly thermally conductive block (in particular having a thermal conductivity of at least 100 W/mK, for example a copper block) may be provided as the heat removal structure of the second component carrier for removing heat from the assigned radiofrequency chip.

In an embodiment, the at least one electronic component is thermally coupled with the heat removal structure for removing heat from the at least one electronic component via the heat removal structure towards said opposing other side to be connected to the cooling unit. Thus, transmission of wireless signals or high-frequency signals may be accomplished via the antenna side of the connected component carriers, whereas heat removal may be carried out via the opposing cooling unit side of the connected component carriers.

In an embodiment, the heat removal structure is configured for spatially spreading heat, created by the at least one component, over the electronic device and in particular in a lateral direction. Hence, the second component carrier may not only remove heat from the electronic component(s) of the first component carrier but may also spatially spread the created heat over a horizontal plane. Distributing heat over a larger volume of the electronic device and in particular laterally may prevent the creation of undesired hotspots and may thereby avoid overheating of the electronic device and parts thereof.

In an embodiment, the heat removal structure comprises at least one highly thermally conductive block (in particular having a thermal conductivity of at least 15 W/mK, in particular of at least 50 W/mK). In an embodiment, the at least one block may comprise a metal block (such as a copper block) and/or a ceramic block (such as an aluminum nitride block) optionally covered with an electrically conductive layer on at least one of two opposing main surfaces thereof (such as a DCB (Direct Copper Bonding) ceramic). For manufacturing a highly thermally conductive block, it is also possible to use sintered materials (for instance using a plasma spray). In one embodiment, a block may be a copper block. Highly advantageously, copper has a high thermal and electric conductivity. Moreover, implementing copper in a component carrier such as a printed circuit board (PCB) does not involve an additional material, which has advantages in terms of keeping CTE (coefficient of thermal expansion) mismatch small. Alternatively, it is possible to embody a block as ceramic block, for instance made of aluminum nitride. Such a ceramic material has a high thermal conductivity and can be rendered electrically conductive (so as to optionally contribute also to the conductance of electricity within the electronic device) by partially or entirely cladding the ceramic block with a metal such as copper. For instance, both a top surface and a bottom surface of the ceramic block may be only partially covered with a copper layer.

In an embodiment, the electronic device comprises a spacer plate, such as a third component carrier having at least one third electrically conductive layer structure and/or having at least one third electrically insulating layer structure (wherein the third component carrier may comprise a third stack, having the at least one third electrically conductive layer structure and/or having the at least one third electrically insulating layer structure). The third component carrier may be arranged as a spacer between the first component carrier and the second component carrier. Descriptively speaking, a spacer board or interface board may be provided (for instance embodied as third component carrier), because it spaces the first and second component carriers at a mutual interface. While spacing the first and second component carriers which may have a surface profile, it is also possible that the third component carrier is provided with one or multiple through holes enabling a direct thermal coupling between a protrusion (for instance formed by an electronic component) of the first component carrier and a planar surface of the second component carrier through the at least one through hole of the third component carrier.

In an embodiment, the spacer plate or third component carrier is configured for conveying electric supply power between the first component carrier and the second component carrier. In particular, this may be accomplished by an electrically conductive through connection extending through the spacer plate or third component carrier. Thus, it may be possible to supply an electric supply current or voltage at a supply terminal of the second component carrier and conduct the electric supply current or voltage to the first component carrier with its electronic component(s) via the interposed spacer plate or third component carrier.

In an embodiment, a main surface of the spacer plate or third component carrier has a surface profile or a structuring being substantially inverse to a surface profile of a counter main surface of the first component carrier. The first component carrier may have a pronounced surface profile due to the mounting (for instance surface mounting) of different electronic components of different heights. The spacer plate or third component carrier may at least partially balance out height variations of the first component carrier and may thereby function as an adapter between the first component carrier and the second component carrier. For this purpose, the spacer plate or third component carrier may have a surface profile on a side facing the first component carrier which may be substantially a negative profile of the first component carrier in the connection area to the spacer plate or third component carrier. However, it is also possible that the spacer plate or third component carrier comprises a structuring or patterning which may include at least one through hole extending through the spacer plate or third component carrier to fulfill the balancing task. In particular, one or more protrusions of the first component carrier (for instance formed by one or more protruding electronic components) may be accommodated in such one or more through holes in the spacer plate or third component carrier.

In an embodiment, the first component carrier is connected with the second component carrier through at least one through hole extending through the spacer plate or third component carrier. Hence, the spacer plate or third component carrier may function as a spacer spacing the first and second component carriers with respect to each other, while simultaneously enabling a direct coupling between the first and second component carriers without material of the spacer plate or third component carrier in between in such a coupling region.

In an embodiment, the at least one electronic component is surface mounted on the first stack. In particular, different electronic components may be surface mounted on the first stack so that the bottom surfaces of the electronic components are at the same vertical levels, and in particular so that the top surfaces of the electronic components are at different vertical levels. This avoids any effort in terms of forming cavities for embedding electronic components of the first component carrier. Due to the protrusion of the surface mounted electronic component(s) beyond the first stack of the first component carrier, and in particular due to different heights of different electronic components (for instance a controller chip may have a larger height than a radiofrequency chip), the above-described spacer board may be sandwiched between the first and second component carriers for at least partially balancing out height differences.

In another embodiment, the at least one electronic component is inserted in at least one cavity in the first stack. In particular, different electronic components may be inserted in different cavities in the first stack so that bottom surfaces of the electronic components are at the same vertical level, and in particular so that top surfaces of the electronic components are at different vertical levels. Such cavities may be formed for example by embedding a poorly adhesive sheet (which may also be denoted as release layer, and which may be made, for example, of a waxy material or Teflon) in the laminated first layer stack of the first component carrier. Thereafter, a piece of the stack above each portion of the poorly adhesive sheet may be circumferentially separated, for instance by laser drilling or laser routing, from the rest of the stack. Due to the poor adhesion between stack material and poorly adhesive sheet, the separated piece(s) of the stack may thereafter be taken out from the stack, so that the cavity or cavities for inserting the electronic component(s) is or are completed. When all bottom surfaces of all electronic components are at the same vertical level, the poorly adhesive sheet portions may be formed as one common patterned layer for all electronic components and thus with low effort. Embedding electronic components in cavities of the first component carrier may contribute to a compact design of the electronic device as well as to extremely short electric and thermal paths. This may, in turn, result in low ohmic and signal losses.

In an embodiment, the first component carrier and the second component carrier are connected by a connection structure in between, in particular by one of the group consisting of an adhesive layer, a solder structure, and a sinter structure. This may improve the mechanical integrity of the electronic device. By such a connection structure or medium, a thermally highly conductive (and optionally low ohmic) coupling between the component carriers may be established. A silver sinter medium or a diffusion bonding medium may be preferred. It may also be possible to establish the connection by thermal compression bonding or by a press fit.

In an embodiment, at least one of the first component carrier and the second component carrier is configured as a high-frequency board. In particular, the at least one of the first component carrier and the second component carrier configured as a high-frequency board comprises at least one of polytetrafluoroethylene, liquid crystal polymer and/or cyanate ester resins. For high frequency applications, such high-frequency materials may be preferred In an embodiment, the first component carrier and the second component carrier are connected by an at least partially curable electrically insulating layer structure arranged between the first component carrier and the second component carrier. In particular, the at least partially curable electrically insulating layer structure comprises at least one of a thermal prepreg, in particular B-stage prepreg, or resin. Such a thermal prepreg may provide a pronounced contribution to heat removal and may therefore be effective at a position between a first component carrier and a second component carrier. Such a thermal prepreg may be at least partially uncured (for instance may comprise B-stage resin) when applied and may be connected by lamination.

In an embodiment, the stack(s) comprise(s) only laminated layer structures. In particular, the stack(s) may be free of mold compound. By interconnecting all layer structures of a respective stack by lamination (i.e., the application of heat and/or pressure) rather than by molding, the introduction of an additional material type (in particular a mold compound) into the component carriers may be avoided, which keeps the thermal stress in the event of temperature changes small.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres, or other kinds of filler particles, for example made of glass (multilayer glass) in order to form a composite, could be used as well. A semi-cured resin in combination with a reinforcing agent, e.g. fibers impregnated with the above-mentioned resins is called prepreg. These prepregs are often named after their properties e.g. FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminium oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above, and further aspects of the invention are apparent from the examples of embodiment to be described hereinafter and are explained with reference to these examples of embodiment.

BRIEF DESCRIPTION OF THE DRAWINGS

FIG. 1 illustrates a cross-sectional view of an electronic device according to an exemplary embodiment of the invention.

FIG. 2 illustrates a cross-sectional view of a structure obtained during carrying out methods of manufacturing electronic devices according to exemplary embodiments of the invention.

FIG. 3 illustrates a cross-sectional view of a structure obtained during carrying out methods of manufacturing electronic devices according to exemplary embodiments of the invention.

FIG. 4 illustrates a cross-sectional view of a structure obtained during carrying out methods of manufacturing electronic devices according to exemplary embodiments of the invention.

FIG. 8 illustrates a cross-sectional view of a structure obtained during carrying out methods of manufacturing electronic devices according to exemplary embodiments of the invention.

FIG. 9 illustrates a cross-sectional view of a structure obtained during carrying out methods of manufacturing electronic devices according to exemplary embodiments of the invention.

FIG. 10 illustrates a cross-sectional view of a structure obtained during carrying out methods of manufacturing electronic devices according to exemplary embodiments of the invention.

FIG. 13 illustrates a cross-sectional view of a structure obtained during carrying out methods of manufacturing electronic devices according to exemplary embodiments of the invention.

FIG. 14 illustrates a cross-sectional view of a structure obtained during carrying out methods of manufacturing electronic devices according to exemplary embodiments of the invention.

FIG. 15 illustrates a cross-sectional view of a structure obtained during carrying out methods of manufacturing electronic devices according to exemplary embodiments of the invention.

FIG. 16 illustrates a cross-sectional view of a structure obtained during carrying out methods of manufacturing electronic devices according to exemplary embodiments of the invention.

FIG. 18 illustrates a cross-sectional view of a structure obtained during carrying out a method of manufacturing an electronic device according to other exemplary embodiments of the invention.

FIG. 19 illustrates a cross-sectional view of a structure obtained during carrying out a method of manufacturing an electronic device according to other exemplary embodiments of the invention.

FIG. 20 illustrates a cross-sectional view of a structure obtained during carrying out a method of manufacturing an electronic device according to other exemplary embodiments of the invention.

FIG. 25 illustrates a cross-sectional view of a structure obtained during manufacturing an electronic device according to another exemplary embodiment of the invention, wherein the alternative of FIG. 25 is obtained based on the structure according to FIG. 5.

FIG. 26 illustrates a cross-sectional view of a structure obtained during manufacturing an electronic device according to another exemplary embodiment of the invention based on a structure according to the exemplary embodiment shown in FIG. 11.

FIG. 27 illustrates a cross-sectional view of a structure obtained during manufacturing an electronic device according to another exemplary embodiment of the invention, based on a structure according to the exemplary embodiment shown in FIG. 11.

FIG. 28 illustrates a cross-sectional view of a structure obtained during carrying out a method of manufacturing electronic devices according to still another exemplary embodiment of the invention.

FIG. 29 illustrates a cross-sectional view of a structure obtained during carrying out a method of manufacturing electronic devices according to still another exemplary embodiment of the invention.

DETAILED DESCRIPTION OF ILLUSTRATED EMBODIMENTS

Figure 5:
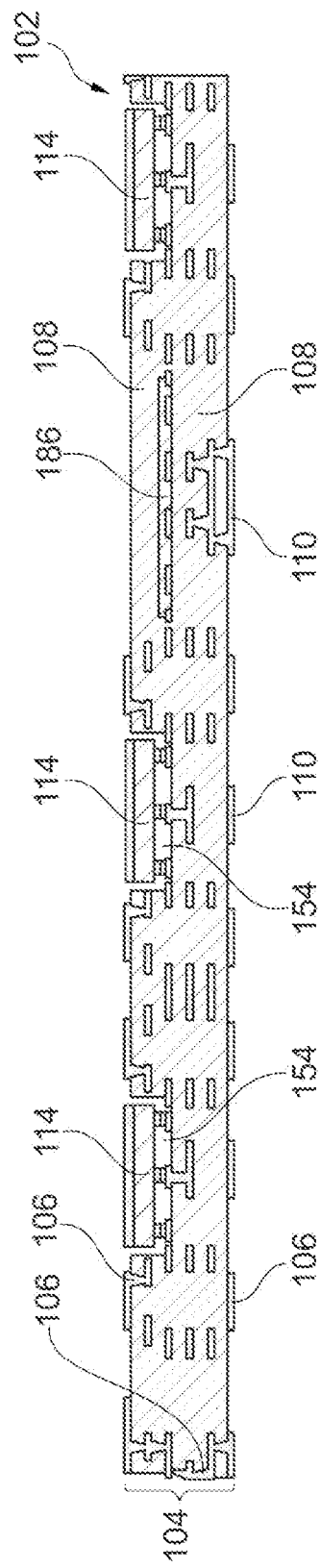
FIG. 5 illustrates a cross-sectional view of a structure obtained during carrying out methods of manufacturing electronic devices according to exemplary embodiments of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

For multilayer constructions of component carriers for radiofrequency (RF) applications which include an antenna array (in particular a 5G antenna array), radiofrequency integrated circuits (RFICs) may be mounted by surface mounted device (SMD) technology. As a result, a component carrier design faces challenges concerning different height of the RFICs. Thermal interface material (TIMs) needs to level out different component heights to contact a heat sink. Consequently, a thicker TIM is needed to handle the different gaps between heat sink and electronic components. This results in a high thermal resistance from the TIM and smaller contact area on the heat sink to transfer the heat.

According to an exemplary embodiment of the invention, an electronic device comprising at least two component carriers is provided, one component carrier having an active antenna array functionality coupled with one or more electronic components which may contribute to a high-frequency functionality. In addition, another component carrier may be provided for promoting heat removal from the aforementioned component carrier and in particular from its one or more electronic components. Hence, the component carriers may be mechanically and thermally, as well as optionally electrically, coupled while the (for instance bottom-sided) signal processing and trans-mission functionality may be spatially separated from the (for instance top-sided) heat removal functionality. Consequently, an advantageous heat management may be synergistically combined with low ohmic losses and signal losses.

In particular, an exemplary embodiment provides an advantageous construction for an active antenna array, in which one or more high-frequency components in cavities are equipped with a thermal connection on the top side to a heat removal structure (in particular comprising heat spreading elements). Furthermore, an electrical insulation of the stacked component carriers to a cooling unit (such as a heat sink) may be ensured, for instance by a dielectric thermal interface material between the stacked component carriers and the cooling unit. On a bottom side of a corresponding electronic device, a component carrier embodied as high-frequency circuit board may be provided, in which an RFIC, an antenna structure and a baseband controller may be arranged in close proximity. Advantageously, a corresponding electronic device according to exemplary embodiments may ensure an improved heat management, a miniaturization of the antenna structure or array, as well as a reduction of signal losses.

According to an exemplary embodiment, it may be possible to mechanically decouple the construction of the high-frequency component carrier from the heat removal component carrier by using an electrically conductive TIM. A corresponding electronic device may accomplish heat spreading with a separate component carrier which may be denoted as heat-sink-multilayer. By the architecture according to an exemplary embodiment of the invention, the size of the electronic components (in particular semiconductor chips) may be significantly reduced.

Exemplary applications of exemplary embodiments of the invention are D-Band antenna arrays for point-to-point antennas (for instance for 5G applications). Advantageously, the heat management (again in particular for 5G applications) may be improved by directly assembling the one or more electronic components (which may include at least one RFIC die, a conversion IC, etc.) on and/or in the antenna board. By additionally using a heat spreader component carrier (which may be denoted as heat-sink-multilayer) between a cooling unit (such as a heat sink) and the one or more electronic components, the thermal performance and thus reliability of the electronic device may be improved.

In order to reduce line losses of the electric signals, the electronic components (in particular at least one RFIC) and the one or more antennas are preferably positioned as close as possible to each other. Since these power amplifiers may be arranged in a grid above the antenna array and can lead to challenges in terms of heating, adequate cooling of the electronic components (and in particular of the RFICs) may be highly advantageous. Exemplary embodiments of the invention offer a solution to both issues: Advantageously, the electronic components (and in particular the RFICs) may be interconnected to antenna groups, which may be directly connected to a control chip (as another one of the electronic components) for carrying out a baseband conversion in a very compact way. These electronic components may be integrated into a multilayer high-frequency board (also denoted as first component carrier) which may ensure an extremely compact construction of an active antenna array. This may be highly appropriate in particular for high-frequency (for instance 5G) applications. In an embodiment, the RFIC-type electronic components may have an average power loss of for example 0.5 W and an entire antenna array may for example have 256 of these RFIC-type electronic components. In the described example, a power loss of around 125 W has to be dissipated. According to an exemplary embodiment of the invention, heat paths may be established in which the RFIC-type electronic components are connected with very low thermal resistances and the heat is passed onto a cooling unit (such as a heat sink) via heat spreading elements included in the second component carrier.

FIG. 1 illustrates a cross-sectional view of an electronic device 100 according to an exemplary embodiment of the invention. This embodiment includes an antenna structure 110 of an active antenna array and comprises electronic components 112, 114 arranged in cavities 154 of a laminated layer stack 104, as will be described in the following in further detail.

The electronic device 100 according to FIG. 1 is composed of a plate-shaped printed circuit board (PCB)-type first component carrier 102, a plate-shaped PCB-type second component carrier 116 and a cooling unit 130 embodied as a heat sink.

As shown, the first component carrier 102 comprises a first stack 104 (here embodied as laminated layer stack, wherein lamination may particularly denote the connection of layer structures 106, 108 of the first stack 104 by the application of pressure and/or heat) having first electrically conductive layer structures 106 and first electrically insulating layer structures 108. At the lower main surface of the first component carrier 102, the electrically conductive layer structures 106 form antenna structure 110 which may comprise one or more antennas, which may be receiving and/or transmitting antennas. Hence, the antenna structure 110 is integrated in the first stack 104. The antenna structure 110 may be configured for transmitting radio-frequency signals to a communication partner device (not shown) and/or for receiving radiofrequency signals from a communication partner device. The antenna structure 110 may be adjusted for proper transmission and/or reception of electromagnetic radiation. For example, the antenna structure 110 may be designed for impedance matching, with appropriate filter properties, as an antenna resonator, etc.

Moreover, the first component carrier 102 comprises a plurality of electronic components 112, 114. More specifically, the electronic components 112, 114 may comprise a plurality of radiofrequency chips 114 (such as RF power amplifier chips providing transmission power for transmitted signals, etc.) and a controller chip 112 (such as a baseband controller chip for controlling operation of the radiofrequency chips 114). At least part of the electronic components 112, 114 may be electrically coupled with the antenna structure 110 and with each other. As shown in FIG. 1 as well, each of the electronic components 112, 114 is inserted in a respective cavity 154 formed in a main surface of the first stack 104 facing the second component carrier 116. As shown, height, D, of the electronic component 112 may be larger than height, d, of each of the electronic components 114. Bottom surfaces 156, 158 of the electronic components 112, 114 may be at the same vertical level, and top surfaces 160, 162 of the electronic components 112, 114 may be at different vertical levels.

Moreover, the second component carrier 116 comprises a second stack 118 (which is here also embodied as laminated layer stack). The second stack 118 comprises second electrically conductive layer structures 120 and second electrically insulating layer structures 122. Apart from this, the second component carrier 116 comprises a heat removal structure 124 which comprises highly thermally conductive blocks 136 integrated in the second stack 118. The electronic components 114, being the main heat sources of the electronic device 100, are thermally coupled with the heat removal structure 124 for removing heat from the respective electronic component 114 via the heat removal structure 124 towards the cooling unit 130. Apart from removing heat out of the electronic device 100, the heat removal structure 124 may also be configured for spatially spreading heat created by the electronic components 112, 114 in a lateral direction according to FIG. 1, i.e., within a horizontal plane of the stacks 104, 118. The plurality of highly thermally conductive blocks 136 may be embodied as copper blocks. Each electronic component 114 is thermally coupled via a thermally conductive solder structure 176 with an assigned highly thermally conductive block 136. Simultaneously, solder structure 176 also establishes a mechanical connection between the first component carrier 102 and the second component carrier 116. In other words, the first component carrier 102 and the second component carrier 116 are rigidly connected by the solder structure 176.

As can be taken from FIG. 1 as well, the first component carrier 102 and the second component carrier 116 are connected so that the antenna structure 110 is positioned at one side 126 (a bottom side according to FIG. 1) of the electronic device 100 for emitting and/or receiving electromagnetic radiation at side 126. In contrast to this, the heat removal structure 124 is positioned at opposing other side 128 (a top side according to FIG. 1) of the electronic device 100 and is thermally connected with the cooling unit 130 at said opposing other side 128.

For example, the electrically conductive layer structure(s) 106, 120 may comprise patterned or continuous copper foils and vertical through-connections, for example copper filled laser vias which may be created by plating. The electrically insulating layer structure(s) 108, 122 may comprise a respective resin (such as a respective epoxy resin), preferably comprising reinforcing particles therein (for instance glass fibers or glass spheres). For instance, the electrically insulating layer structures 108, 122 may be made of prepreg or FR4.

In the shown embodiment, the cooling unit 130 comprises a thermally conductive bulk body 180 (such as a metal plate) which is integrally formed with an array of cooling fins 182 (such as metal strips extending perpendicular from the metal plate and being mutually spaced) extending there-from. Hence, cooling unit 130 may function as a heat sink for dissipating heat created by the electronic components 112, 114 which is removed out of the component carriers 102, 116 by the heat removal structure 124 towards an environment of the electronic device 100.

For further promoting the heat removal, an electrically insulating thermal coupling structure 132 (such as a thermal interface material, TIM, or a thermal prepreg) may be arranged between the second component carrier 116 and the cooling unit 130. In addition to its thermal coupling function, the dielectric property of the thermal coupling structure 132 improves the electric isolation properties of the electronic device 100.

An electric supply voltage or current may be supplied to the electronic device 100 at a terminal on the top side of the second component carrier 116 and may be supplied to the electronic components 112, 114 of the first component carrier 102 via an electrically conductive connection established by the electrically conductive layer structures 106, 120 and a solder structure 176 directly in between (see right hand side of FIG. 1).

During operation of the electronic device 100, wireless radiofrequency signals may be transmitted and/or received by the antenna structure 110 under control of and being processed by the electronic components 112, 114. Heat created during this process in particular in electronic components 114 may be conducted through the highly thermally conductive blocks 136 vertically through the second component carrier 116 and up to the thermally connected cooling unit 130 for heat dissipation towards an environment. Due to the illustrated and above-described design of the electronic device 100, electric and thermal paths may be very short which may reduce the amount of generated ohmic heat as well as signal losses. Created heat may be removed efficiently away from the antenna structure 110 and may be spread and dissipated so as to avoid hot spots. This ensures an efficient cooling and a high accuracy in signal transmission and processing, hence resulting in a high performance of the electronic device 100.

Descriptively speaking, electronic device 100 according to FIG. 1 comprises a multilayer RF-board in form of first component carrier 102, which forms an antenna array (see antenna structure 110) with connections to the RFIC-type electronic components 114 each located in a respective cavity 154. A further cavity 154 contains the electronic component 112 embodied as baseband controller and thereby reduces the mounting height of the electronic component 112. An advantageous heat distributing and conducting concept is achieved by providing a substantially uniform surface of the RF-antenna board with integrated electronic components 112, 114 to mount the heat spreading elements in form of blocks 136, which are embedded in a heat-sink-multilayer of the second component carrier 116. Both PCBs, i.e., component carriers 102, 116, may be connected with a highly thermal conductive material, which can be the solder structure 176, or alternatively a silver sinter paste, transliquid-solder paste, etc.

Since electronic component 112 protrudes vertically with respect to the rest of the first component carrier 102, the second component carrier 116 may be formed with a recess 184 for accommodating a protruding portion of the electronic component 112. According to FIG. 1, the different electronic components 112, 114 may be inserted in different cavities 154 in the first stack 104 so that bottom surfaces 156, 158 of the electronic components 112, 114 are at the same vertical levels, whereas top surfaces 160, 162 of the electronic components 112, 114 are at different vertical levels. FIG. 1 also shows that the top surfaces 162 of the electronic components 114 may be substantially aligned with an upper main surface of the first stack 104 which simplifies and improves the thermal coupling with the highly thermally conductive blocks 136 of the second component carrier 116.

FIG. 2 to FIG. 16 illustrate cross-sectional views of structures obtained during carrying out methods of manufacturing electronic devices 100 according to exemplary embodiments of the invention.

FIG. 2 shows a first stack 104, embodied as laminated layer stack, of a PCB-type first component carrier 102 composed of electrically conductive layer structures 106 and electrically insulating layer structures 108. The bottom portion of the electrically conductive layer structures 106 may be configured as an antenna structure 110 for wireless signal transmission on the bottom side. Release layers 186 made of a poorly adhesive material such as polytetrafluoroethylene (PTFE) are embedded in the first stack 104. The release layers 186 define positions at which cavities 154 for accommodating electronic components 112, 114 will be subsequently formed.

In order to obtain the structure shown in FIG. 3, the structure according to FIG. 2 may be subjected to a laser cutting process. By circumferentially (in particular laser) cutting out a piece of stack material above a respective release layer 186 and subsequently removing the cut-out pieces making use of the poorly adhesive property of the release layers 186, cavities 154 are obtained.

The structure shown in FIG. 4 is obtained by removing the exposed release layers 186 from the bottom of the cavities 154, for instance by etching or stripping.

In order to obtain the structure shown in FIG. 5, a radiofrequency chip-type electronic component 114 is inserted in each of the cavities 154. Preferably, top surfaces of the electronic components 114 are in alignment with or are in flush with an upper main surface of the first stack 104.

Figure 6:
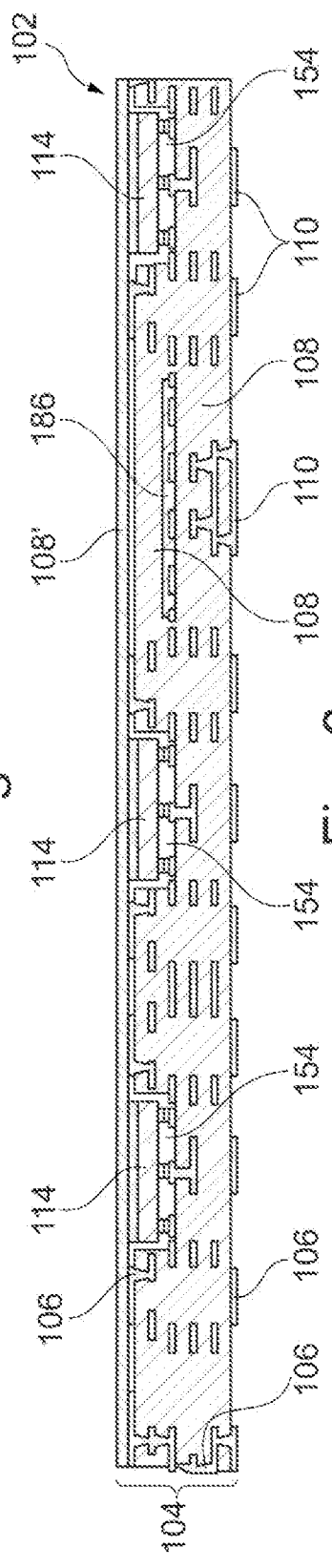
FIG. 6 illustrates a cross-sectional view of a structure obtained during carrying out methods of manufacturing electronic devices according to exemplary embodiments of the invention.

The structure according to FIG. 6 may be obtained by connecting an at least partially uncured electrically insulating layer structure 108' (such as B-stage prepreg or resin) to an upper main surface of the structure shown in FIG. 5.

Figure 7:
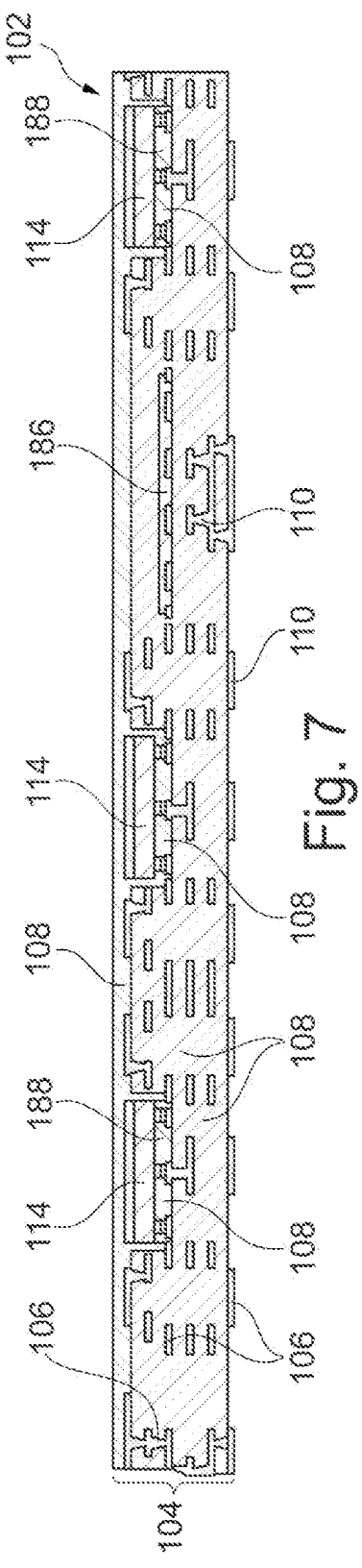
FIG. 7 illustrates a cross-sectional view of a structure obtained during carrying out methods of manufacturing electronic devices according to exemplary embodiments of the invention.

Referring to FIG. 7, a lamination process may be carried out by the application of pressure and/or heat to the structure shown in FIG. 6. The remaining hollow spaces of the cavities 154 are thereby filled with resin from the previously uncured electrically insulating layer structure 108' during the lamination process. Descriptively speaking, the previously uncured electrically insulating layer structure 108' may become flowable during lamination and may thus flow into empty gaps of the cavities 154. By the elevated temperature and/or the mechanical pressure applied during lamination, said previously uncured electrically insulating layer structure 108' may be cured (for instance by polymerizing, cross-linking, etc.) and may thereby be re-solidified. Moreover, FIG. 7 shows an optional dielectric underfill 188 which may be filled in the cavities 154 below the respective electronic component 114.

As shown in FIG. 8, portions of the top-sided and now cured electrically insulating layer structure 108 protruding beyond the uppermost electrically conductive layer structure 106 and on the electronic components 114 may then be removed, for example by grinding.

In order to obtain the structure shown in FIG. 9, the structure according to FIG. 8 may be subjected to a further laser cutting process. By circumferentially (in particular laser) cutting out a piece of stack material above a remaining release layer 186 and subsequently removing the cut-out piece making use of the poorly adhesive property of the release layer 186, a further cavity 154 is obtained.

The structure shown in FIG. 10 is obtained by removing the exposed release layer 186 from the bottom of the additionally formed cavity 154, for instance by etching or stripping.

Figure 11:
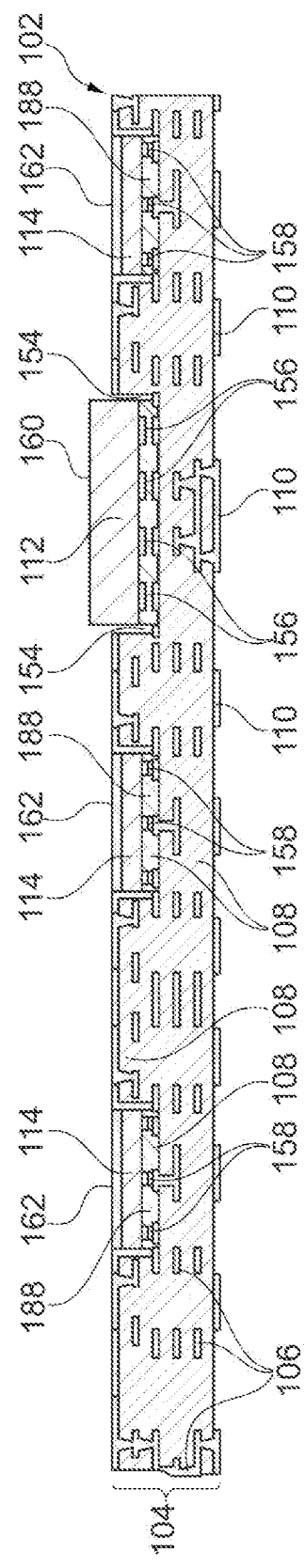
FIG. 11 illustrates a cross-sectional view of a structure obtained during carrying out methods of manufacturing electronic devices according to exemplary embodiments of the invention.

In order to obtain the structure shown in FIG. 11, a baseband controller chip-type electronic component 112 is inserted in the additional cavity 154. In view of its larger thickness as compared to the electronic components 114, electronic component 112 may vertically protrude beyond an upper main surface of the first stack 104.

Figure 12:
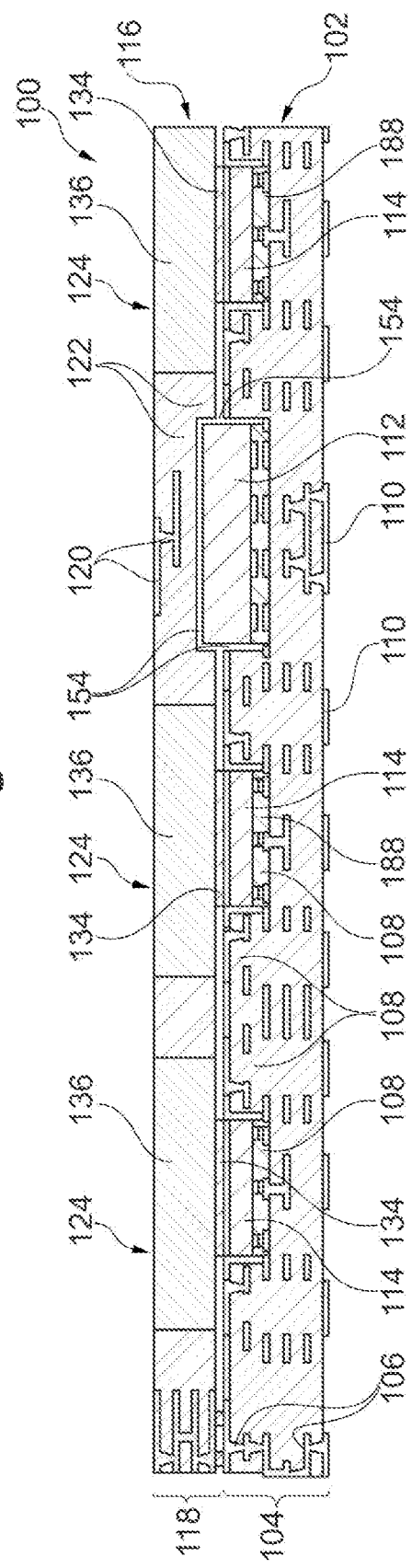
FIG. 12 illustrates a cross-sectional view of a structure obtained during carrying out methods of manufacturing electronic devices according to exemplary embodiments of the invention.

The electronic device 100 according to FIG. 12 is obtained by connecting a second component carrier 116, which may also be embodied as a plate-shaped printed circuit board, to the first component carrier 102 processed according to FIG. 11. The second component carrier 116 is manufactured as laminated layer stack 118 of second electrically conductive layer structures 120 and second electrically insulating layer structures 122. Copper blocks 136 are embedded in cut-out portions of the second stack 118 and may be connected with second stack 118 for example by glue or lamination. Component carriers 102, 116 are interconnected with a second thermally conductive coupling structure 134 in between. Preferably, the second thermally conductive coupling structure 134 between the component carriers 102, 116 is electrically conductive, for instance embodied as carbon paste, since this may allow to use a material with very high thermal conductivity of for example 30 W/mK or more.

Thereafter and as shown in FIG. 13, a further thermally conductive coupling structure 132 is applied to the top main surface of the second component carrier 116. When the second thermally conductive coupling structure 134 is electrically conductive, it is preferred that the first thermally conductive coupling structure 132 to be interposed between second component carrier 116 and a cooling unit 130 is electrically insulating for ensuring proper electric isolation.

FIG. 14 shows the electronic device 100 after having attached cooling unit 130 to the first thermally conductive coupling structure 132. For instance, the first thermally conductive coupling structure 132 may be a thermal interface material (TIM) or a thermal prepreg.

The embodiment of FIG. 15 differs from the embodiment of FIG. 13 in that a metal layer 164 (for instance made of copper) may be pressed on the thermally conductive coupling structure 132 for further enhancing heat coupling.

Referring to FIG. 16, the cooling unit 130 and the metal layer 164 on the top side of the stacked component carriers 104, 118 may be interconnected by a connection structure 190, in particular by soldering.

Figure 17:
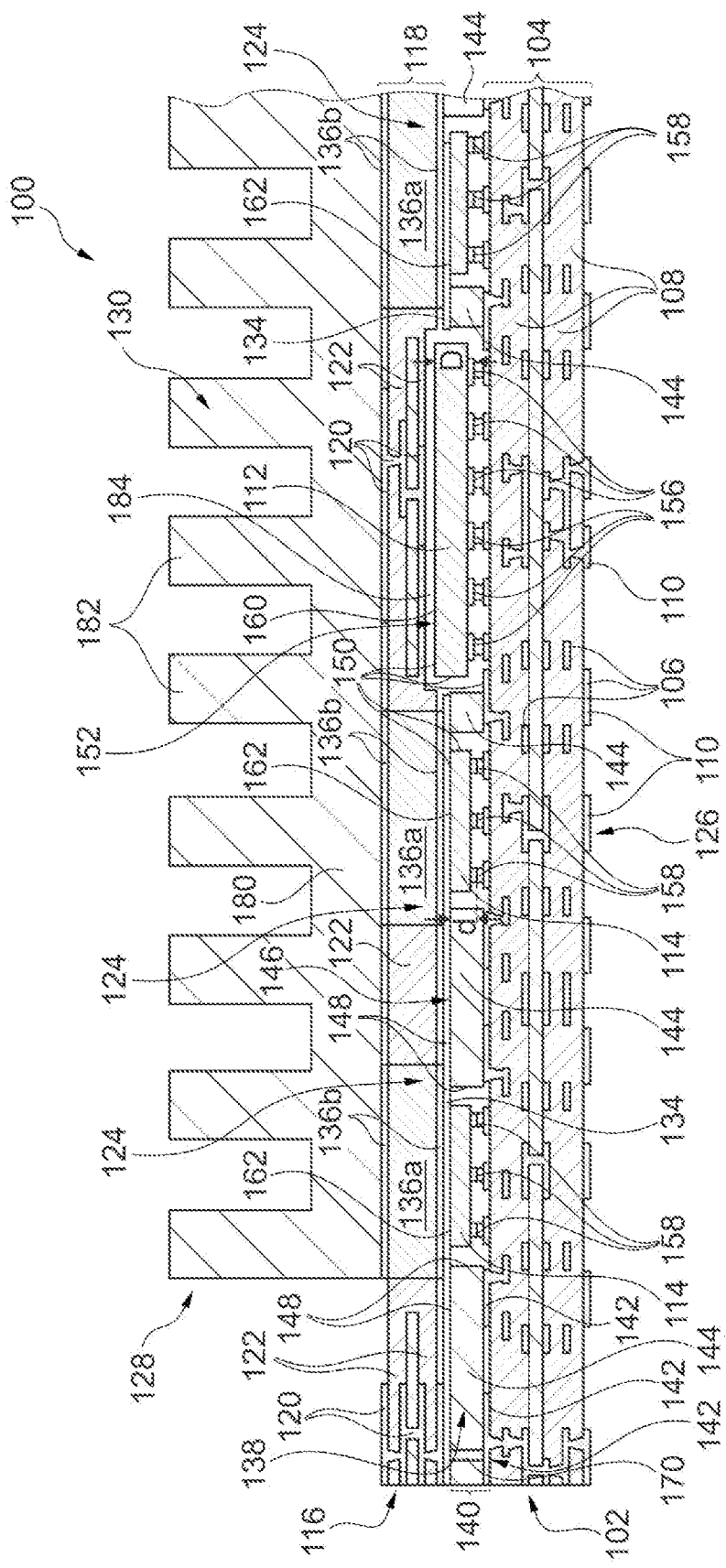
FIG. 17 illustrates a cross-sectional view of an electronic device according to another exemplary embodiment of the invention.

FIG. 17 illustrates a cross-sectional view of an electronic device 100 according to another exemplary embodiment of the invention. The embodiment of FIG. 17 may be denoted as an electronic device 100 with active antenna array and an additional heat-sink-multilayer in form of an additional third component carrier 138 or even a simple spacer plate.

Hence, the embodiment of FIG. 17 differs substantially from the embodiment of FIG. 1 in that, according to FIG. 17, plate-shaped PCB-type third component carrier 138 is additionally provided which comprises a third stack 140 (which may be a further laminated layer stack) which may have a third electrically conductive layer structure 142 and one or more third electrically insulating layer structures 144. As shown, the third component carrier 138 can be arranged as a spacer board between the first com-ponent carrier 102 and the second component carrier 116.

Thanks to an electrically conductive through connection 170 (which may be a copper-filled through hole) as a third electrically conductive layer structure 142, the third component carrier 138 is configured for conducting electric supply power from the second component carrier 116 to the first component carrier 102.

In the embodiment of FIG. 17, the electronic components 112, 114 are surface mounted on the first stack 104. In view of the different thick-nesses D, d, of the different surface mounted electronic components 112, 114 with their bottom surfaces 156, 158 being at the same vertical levels, their top surfaces 160, 162 are at different vertical levels. For at least partially balancing out said heights differences, an upper main surface 146 of the third component carrier 138 has a surface profile or structuring 148 being substantially inverse to a surface profile 150 of a counter main surface 152 of the first component carrier 102. Said structuring 148 of the third component carrier 138 may comprise through holes extending through the third component carrier 138, wherein the through holes in the third component carrier 138 may accommodate protruding portions of the first component carrier 104, i.e., the electronic components 112, 114 in the shown embodiment. This can be accomplished according to FIG. 17 by forming through holes in the third stack 140, each through hole accommodating a respective one of the electronic components 112, 114. By taking this measure, the first component carrier 102 can be connected directly with the second component carrier 116 through the through holes extending through the third component carrier 138. As in FIG. 1, a shallow recess 184 may be formed in a bottom surface of the second component carrier 116 for accommodating a protruding portion of the electronic component 112.

For further promoting the heat removal capability, electronic device 100 according to FIG. 17 comprises a second thermally conductive coupling structure 134 arranged between and with direct physical contact with the first component carrier 102 and the second component carrier 116. Preferably, the second thermally conductive coupling structure 134 is electrically insulating for further increasing the electric reliability of the properly insulated electronic device 100.

Thus, the embodiment of FIG. 17 relates to a multilayer RF-board, which forms an antenna-array with connections to the RFIC-type electronic components 114 and the baseband controller-type electronic component 112 by SMD mounting. Spacer board or third component carrier 138 forms the mechanical interconnection to the heat-sink-multilayer of the second component carrier 116. The electronic components 114 obtain their thermally conductive connection by thermal interface material according to reference sign 134 with high thermal conductivity. The heat sink-type cooling unit 130 may be connected to the heat-sink-multilayer by an electrically isolating thermal interface material.

The embodiment of FIG. 17 further differs from the embodiment of FIG. 1 in particular in that, according to FIG. 17, each of said blocks 136 (rather than consisting of copper) comprise a respective ceramic block 136*a* optionally covered with a respective electrically conductive layer 136*b* on a top side and/or on a bottom side of the respective ceramic block 136*a*. Each ceramic block 136*a* may be made for example of aluminum nitride.

FIG. 18 to FIG. 24 illustrate cross-sectional views of structures obtained during carrying out methods of manufacturing electronic devices 100 according to other exemplary embodiments of the invention.

Referring to FIG. 18, a component carrier 102 having substantially the same properties as shown in FIG. 2 may be used as a starting point. However, the component carrier 102 according to FIG. 18 does not comprise embedded release layers 186.

The structure shown in FIG. 19 can be obtained by surface mounting the electronic components 112, 114 on the first stack 104. During such a surface mounting, an electrically conductive connection between the electronic components 112, 114 and the first electrically conductive layer structures 106 may be established.

As shown in FIG. 20, third component carrier 138 or spacer board provided as a plate with through holes for accommodating the electronic components 112, 114 is attached to the structure shown in FIG. 19. As shown, the third component carrier 138 is additionally provided with an access hole 168 for later forming an electrically conductive connection between the first component carrier 104 and a second component carrier 118 through the third component carrier 138.

Figure 21:
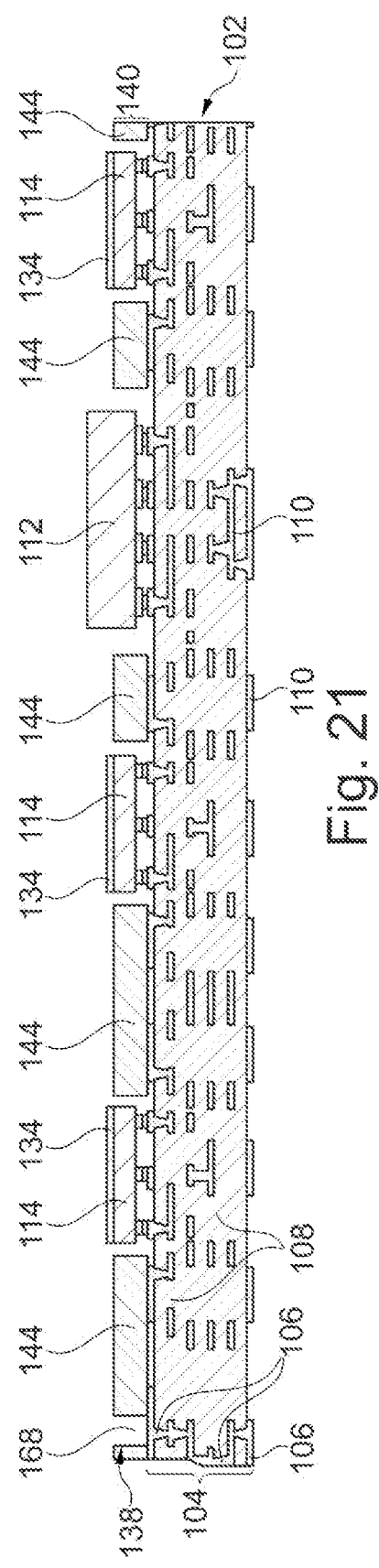
FIG. 21 illustrates a cross-sectional view of a structure obtained during carrying out a method of manufacturing an electronic device according to other exemplary embodiments of the invention.

Referring to FIG. 21, a second thermally conductive coupling structure 134 is formed on the exposed top surfaces of the electronic components 114.

Figure 22:
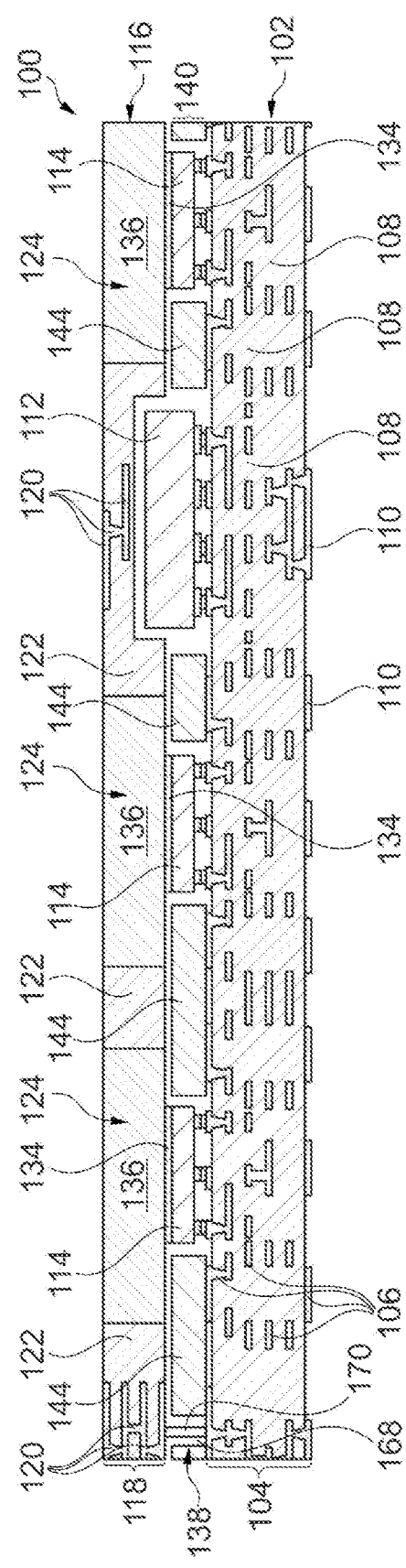
FIG. 22 illustrates a cross-sectional view of a structure obtained during carrying out a method of manufacturing an electronic device according to other exemplary embodiments of the invention.

The electronic device 100 according to FIG. 22 is obtained by connecting a second component carrier 116, which may be embodied substantially as described referring to FIG. 12, to the stack of the first component carrier 102 and the third component carrier 138 according to FIG. 21. According to FIG. 22, the third component carrier 138 is advantageously configured for conveying electric supply power between the first component carrier 102 and the second component carrier 116 by electrically conductive through connection 170 extending through the third component carrier 138. Electrically conductive through connection 170, for instance a copper filled vertical through connection or a copper pillar, may be connected at a bottom side to one of the first electrically conductive layer structures 106 and on the top side to one of the second electrically conductive layer structures 120.

Figure 23:
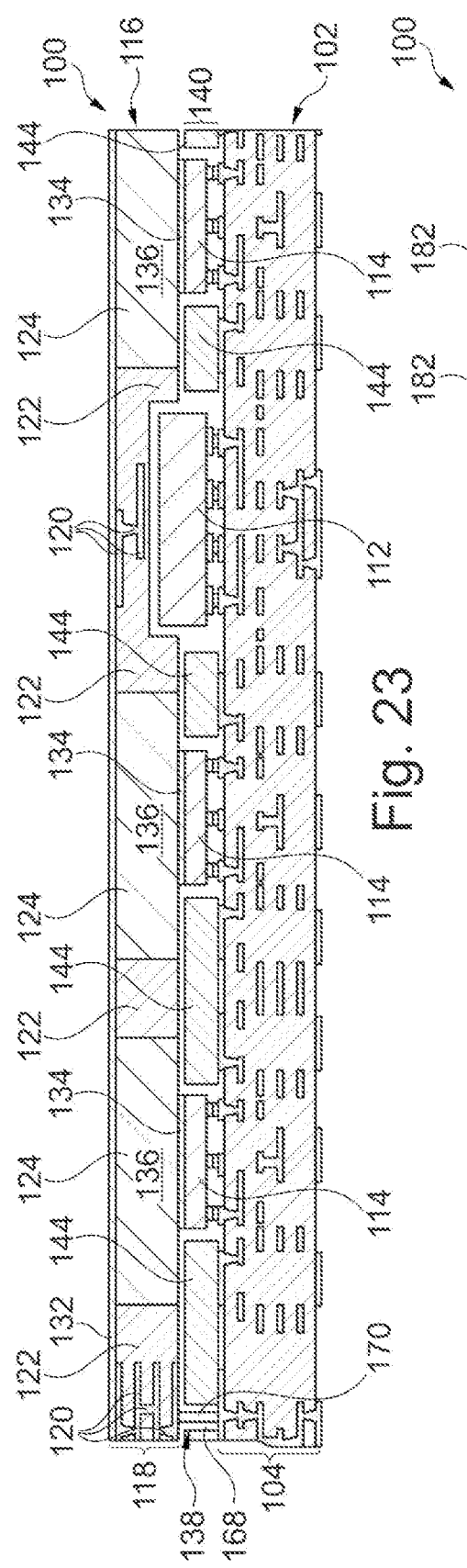
FIG. 23 illustrates a cross-sectional view of a structure obtained during carrying out a method of manufacturing an electronic device according to other exemplary embodiments of the invention.
Figure 24:
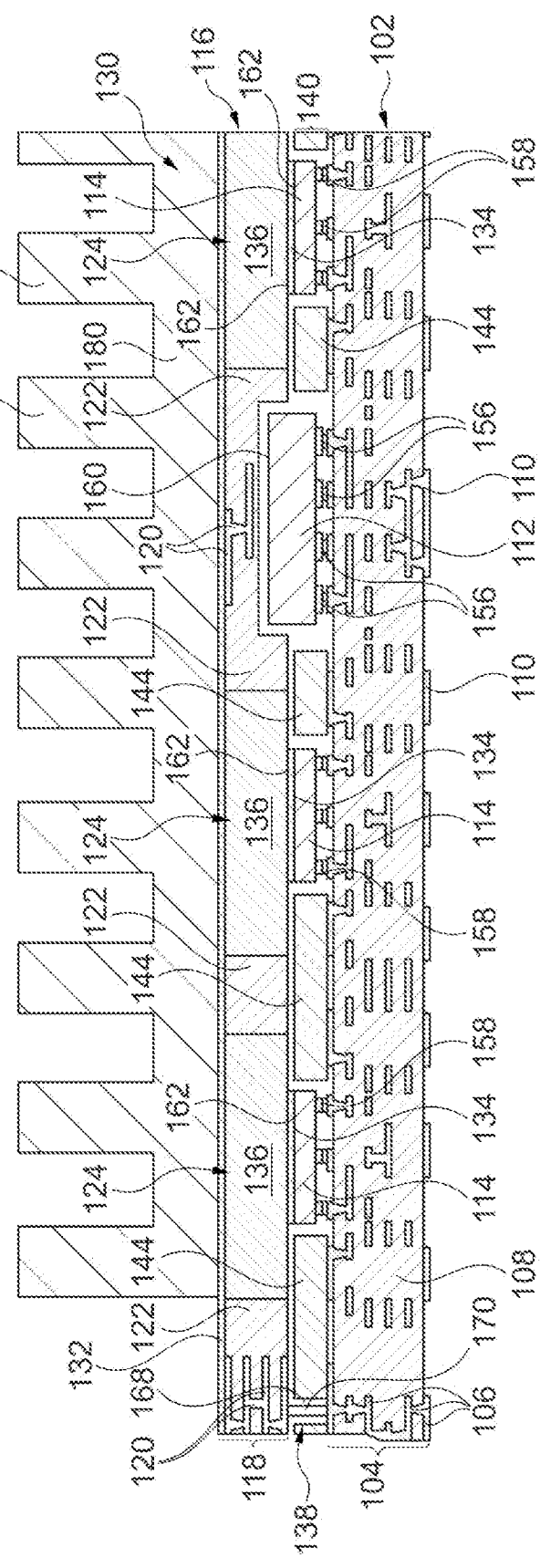
FIG. 24 illustrates a cross-sectional view of a structure obtained during carrying out a method of manufacturing an electronic device according to other exemplary embodiments of the invention.

Referring to FIG. 23, a thermally conductive coupling structure 132 may be applied on top, and then cooling unit 130 is attached, compare FIG. 24.

FIG. 25 illustrates a cross-sectional view of a structure obtained during manufacturing an electronic device 100 according to another exemplary embodiment of the invention, wherein the alternative of FIG. 25 is obtained based on the structure according to FIG. 5. According to FIG. 25 (as an alternative to the lamination of an at least partially uncured electrically insulating layer structure 108' as in FIG. 6), gaps of cavity 154 remaining after inserting electronic component 114 in the respective cavity 154 may be at least partially filled by inserting an adhesive gap filler 172, which may be applied for instance by dispensing.

FIG. 26 and FIG. 27 illustrate cross-sectional views of structures obtained during manufacturing an electronic device 100 according to another exemplary embodiment of the invention, wherein the alternative of FIG. 26 and FIG. 27 is obtained based a structure similar to FIG. 11.

Referring to FIG. 26, the first component carrier 102 and the second component carrier 116 are connected by a connection structure in between, in particular by an adhesive layer 174. The adhesive layer 174 is applied to an upper main surface of the first component carrier 102 apart from the electronic components 112, 114. As shown in FIG. 27, the component carriers 104, 116 may then be glued together using the adhesive layer 174 in between.

Figure 30:
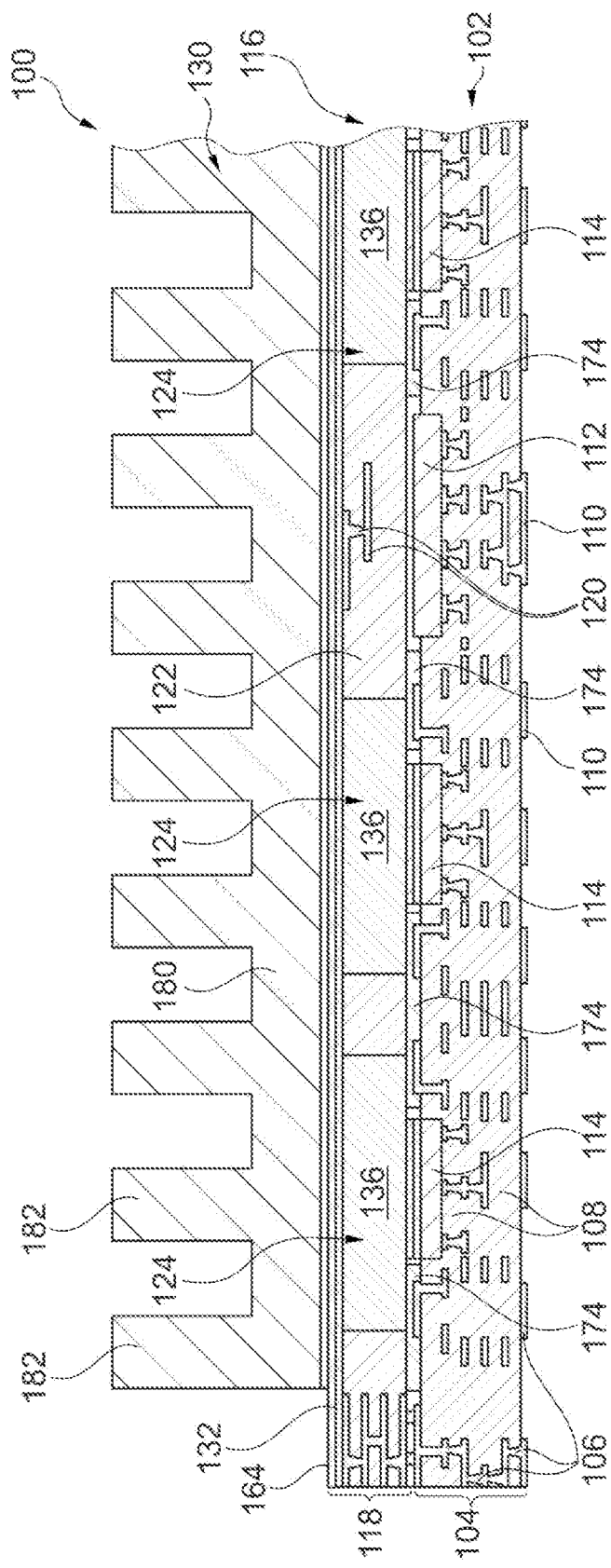
FIG. 30 illustrates a cross-sectional view of a structure obtained during carrying out a method of manufacturing electronic devices according to still another exemplary embodiment of the invention.

FIG. 28 to FIG. 30 illustrate cross-sectional views of structures obtained during carrying out a method of manufacturing electronic devices 100 according to still another exemplary embodiment of the invention.

As shown in FIG. 28, two first component carriers 102 with properties as described above may be formed on two opposing main surfaces of an auxiliary layer 192. For instance, the electronic components 112, 114 may be embedded in a coreless way on both sides of the auxiliary layer 192. Alternatively, the electronic components 112, 114 may be inserted in cut-outs of a respective core attached above and below the auxiliary layer 192. Thereafter, further electrically conductive layer structures 106 and electrically insulating layer structures 108 may be built up on both sides, to thereby obtain the arrangement of FIG. 28. Vias may be used for electrically coupling the electronic components 112, 114 with a signal layer. Alternatively, the electronic components 112, 114 may be directly mounted on a signal layer.

The two individual first component carriers 102 may then be removed from the auxiliary layer 192 and may be further processed separately.

Referring to FIG. 29, one of said first component carriers 102 can then be connected with a second component carrier 116 and a cooling unit 130 in a similar way as described above referring to FIG. 14. As shown in FIG. 30, it is also possible to add a metal layer 164 and a connection structure 190 (such as a solder structure), similar as in FIG. 16.

It should be noted that the term "comprising" does not exclude other elements or steps and the article "a" or "an"

does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An electronic device, comprising:
a first component carrier which comprises a first stack, having at least one first electrically conductive layer structure forming an antenna structure and having at least one first electrically insulating layer structure, wherein the first component carrier further comprises at least one electronic component; and
a second component carrier having at least one second electrically conductive layer structure and/or at least one second electrically insulating layer structure, wherein the second component carrier further comprises a heat removal structure;
wherein the first component carrier and the second component carrier are connected so that the antenna structure is positioned at one side of the electronic device for emitting and/or receiving electromagnetic radiation and the heat removal structure is positioned at an opposing other side of the electronic device;
wherein the electronic device comprises a first thermally conductive coupling structure between the first component carrier and the second component carrier; or
wherein the first component carrier and the second component carrier are connected by an at least partially curable electrically insulating layer structure arranged between the first component carrier and the second component carrier.

2. The electronic device according to claim 1, wherein the heat removal structure is thermally connectable with a cooling unit.

3. The electronic device according to claim 2, comprising the cooling unit connected at the opposing other side.

4. The electronic device according to claim 3, wherein the cooling unit comprises one of the group consisting of a thermally conductive bulk body, a liquid cooling system, and a gas cooler comprising a ventilator.

5. The electronic device according to claim 1, wherein when the electronic device includes the first thermally conductive coupling structure a second thermally conductive coupling structure thermally couples the second component carrier with the cooling unit.

6. The electronic device according to claim 1, wherein the first thermally conductive coupling structure is an electrically insulating thermal coupling structure.

7. The electronic device according to claim 1, comprising at least one of the following features:
wherein the at least one electronic component comprises at least one controller chip;
wherein the at least one electronic component comprises at least one radio-frequency chip.

8. The electronic device according to claim 1, wherein a second thermally conductive coupling structure is one of an electrically conductive thermal coupling structure and an electrically insulating thermal coupling structure.

9. The electronic device according to claim 1, comprising at least one of the following features:
wherein the at least one electronic component is thermally coupled with the heat removal structure for removing heat from the at least one electronic component via the heat removal structure towards said opposing other side to be connected to the cooling unit;
wherein the heat removal structure is configured for spatially spreading heat created by the at least one electronic component.

10. The electronic device according to claim 1, wherein the heat removal structure comprises at least one thermally conductive block.

11. The electronic device according to claim 1, further comprising:
a spacer plate or a third component carrier between the first component carrier and the second component carrier.

12. The electronic device according to claim 11, comprising at least one of the following features:
wherein the spacer plate or the third component carrier is configured for conducting electric supply power between the first component carrier and the second component carrier by an electrically conductive through connection extending through the spacer plate or the third component carrier;
wherein a main surface of the spacer plate or the third component carrier has a surface profile or a structuring being substantially inverse to a surface profile of a counter main surface of the first component carrier;
wherein the first component carrier is connected with the second component carrier through at least one through hole extending through the spacer plate or the third component carrier.

13. The electronic device according to claim 1, wherein the at least one electronic component is in at least one cavity in the first stack.

14. The electronic device according to claim 1, wherein the at least one electronic component is surface mounted on the first stack.

15. The electronic device according to claim 1, wherein different electronic components are inserted in different cavities in the first stack so that bottom surfaces of the electronic components are at the same vertical level, and top surfaces of the electronic components are at different vertical levels.

16. The electronic device according to claim 1, wherein different electronic components are surface mounted on the first stack so that bottom surfaces of the electronic components are at the same vertical level, and top surfaces of the electronic components are at different vertical levels.

17. The electronic device according to claim 1, wherein the first component carrier and the second component carrier are connected by a connection structure selected from the group consisting of an adhesive layer, a solder structure, and a sinter structure.

18. The electronic device according to claim 1, wherein at least one of the first component carrier and the second component carrier comprises at least one of polytetrafluoroethylene, liquid crystal polymer and/or cyanate ester resins.

19. The electronic device according to claim 1, wherein the at least partially curable electrically insulating layer structure comprises at least one of a thermal prepreg, B-stage prepreg, or resin.

20. A method of manufacturing an electronic device, the method comprising:
forming a first component carrier which comprises a first stack, having at least one first electrically conductive layer structure forming an antenna structure and having at least one first electrically insulating layer structure, wherein the first component carrier further comprises at least one electronic component;

forming a second component carrier having at least one second electrically conductive layer structure and/or at least one second electrically insulating layer structure, wherein the second component carrier further comprises a heat removal structure; and connecting the first component carrier and the second component carrier so that the antenna structure is positioned at one side of the electronic device for emitting and/or receiving electromagnetic radiation and the heat removal structure is positioned at an opposing other side of the electronic device;

wherein the electronic device comprises a thermally conductive coupling structure between the first component carrier and the second component carrier; or wherein the first component carrier and the second component carrier are connected by an at least partially curable electrically insulating layer structure arranged between the first component carrier and the second component carrier.

\* \* \* \* \*